United States Patent
Makiyama

(10) Patent No.: US 12,283,922 B2
(45) Date of Patent: Apr. 22, 2025

(54) MANUFACTURING METHOD FOR COMPOUND SEMICONDUCTOR DEVICE

(71) Applicant: Fujitsu Limited, Kawasaki (JP)

(72) Inventor: Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 18/484,469

(22) Filed: Oct. 11, 2023

(65) Prior Publication Data
US 2024/0039486 A1 Feb. 1, 2024

Related U.S. Application Data

(62) Division of application No. 16/777,944, filed on Jan. 31, 2020, now abandoned.

(30) Foreign Application Priority Data

Feb. 5, 2019 (JP) .................. 2019-19110

(51) Int. Cl.
H10D 30/01 (2025.01)
H01L 21/02 (2006.01)
(Continued)

(52) U.S. Cl.
CPC ......... H03F 3/195 (2013.01); H01L 21/0254 (2013.01); H03F 1/3205 (2013.01);
(Continued)

(58) Field of Classification Search
CPC .................. H01L 29/66462; H10D 30/015
See application file for complete search history.

(56) References Cited

U.S. PATENT DOCUMENTS

2011/0095336 A1 4/2011 Zundel et al.
2015/0295074 A1 10/2015 Ozaki et al.
(Continued)

FOREIGN PATENT DOCUMENTS

JP 2007-173426 A 7/2007
JP 2008-205095 A 9/2008
(Continued)

OTHER PUBLICATIONS

Park J. "Comparison of AlGaN/GaN High Electron Mobility Transistor with AlN or GaN as a cap layer" available online at Research Gate as of Jul. 14, 2015 at https://www.researchgate.net/publication/280028052_Comparison_of_AlGaN GaN_High_Electron_ Mobility_ Transistor with_Al N_or GaN_as_a_cap_layer (Year: 2015) *cited on 892 in U.S. Appl. No. 16/777,944 (paper 20230408).
(Continued)

Primary Examiner — Grant S Withers
(74) Attorney, Agent, or Firm — Fujitsu Intellectual Property Center

(57) ABSTRACT

A manufacturing method for a compound semiconductor device, a semiconductor laminate structure, including an electron transit layer and an electron supply layer that are formed from compound semiconductor. A source electrode, a gate electrode, and a drain electrode are provided above the semiconductor laminate structure and arranged in a first direction. A first insulating film having a first internal stress is formed over the semiconductor laminate structure and between the gate electrode and the drain electrode. A slit extending in the first direction is defined in the first insulating film. An amplifier with a compensating circuit compensates distortion of an input signal of the semiconductor device.

1 Claim, 35 Drawing Sheets

(51) Int. Cl.
  *H03F 1/32*      (2006.01)
  *H03F 3/195*     (2006.01)
  *H03F 3/21*      (2006.01)
  *H10D 30/47*     (2025.01)
  *H10D 62/824*    (2025.01)
  *H10D 62/85*     (2025.01)
  *H01L 21/027*    (2006.01)
  *H01L 21/285*    (2006.01)
  *H01L 21/306*    (2006.01)
  *H01L 23/00*     (2006.01)
  *H02M 1/42*      (2007.01)
  *H02M 3/335*     (2006.01)
  *H10D 62/815*    (2025.01)

(52) U.S. Cl.
  CPC .............. *H03F 1/3241* (2013.01); *H03F 3/21* (2013.01); *H10D 30/015* (2025.01); *H10D 30/475* (2025.01); *H10D 62/824* (2025.01); *H10D 62/8503* (2025.01); *H01L 21/0217* (2013.01); *H01L 21/02175* (2013.01); *H01L 21/02211* (2013.01); *H01L 21/02266* (2013.01); *H01L 21/02274* (2013.01); *H01L 21/02378* (2013.01); *H01L 21/02458* (2013.01); *H01L 21/0262* (2013.01); *H01L 21/0273* (2013.01); *H01L 21/28575* (2013.01); *H01L 21/30621* (2013.01); *H01L 24/32* (2013.01); *H01L 24/45* (2013.01); *H01L 24/48* (2013.01); *H01L 24/73* (2013.01); *H01L 2224/32245* (2013.01); *H01L 2224/45124* (2013.01); *H01L 2224/48247* (2013.01); *H01L 2224/73265* (2013.01); *H01L 2924/13064* (2013.01); *H02M 1/4225* (2013.01); *H02M 3/33576* (2013.01); *H10D 62/8162* (2025.01)

(56) References Cited

U.S. PATENT DOCUMENTS

| | | |
|---|---|---|
| 2017/0092753 A1 | 3/2017 | Prechtl et al. |
| 2018/0294341 A1 | 10/2018 | Chen et al. |
| 2020/0365717 A1 | 11/2020 | Takemoto et al. |
| 2021/0320199 A1 | 10/2021 | Liu et al. |

FOREIGN PATENT DOCUMENTS

| | | |
|---|---|---|
| JP | 2009-267155 A | 11/2009 |
| JP | 2010-182829 A | 8/2010 |
| JP | 2011-91406 A | 5/2011 |
| JP | 2015-79800 A | 4/2015 |

OTHER PUBLICATIONS

Takuda H. "High Al Composition AlGaN-Channel High-Electron-Mobility Transistor on AlN Substrate" App. Phys. Exp. 3, Dec. 3, 2010 p. 121003-1 through 121003-3 (Year: 2010) *cited on 892 in U.S. Appl. No. 16/777,944 (paper 20230408).

Osipov K. "Local 2DEG Density Control in Heterostructure of Piezoelectric Materials and its Application in GaN HEMT Fabrication Technology" IEEE Transactions on Electron Dev. Vol. 65, No. 8 Aug. 2018 pp. 3176-3184 (Year: 2018) *cited on 892 in U.S. Appl. No. 16/777,944 (paper 20221018.

Ando Y. "10-W/mm AlGaN—GaN H Fet with Field Modulating Plate" IEEE Elec. Dev. Lett. vol. 24, No. 5 May 2003 pp. 289-291 (Year: 2003) *cited on 892 in U.S. Appl. No. 16/777,944 (paper 20221018.

Japanese Office Action mailed Jun. 28, 2022 for corresponding Japanese Patent Application No. 2019-019110, with English Translation, 9 pages. *cited on 892 in U.S. Appl. No. 16/777,944 (paper 20221018.

USPTO, Final Rejection mailed Aug. 17, 2023, in connection with parent U.S. Appl. No. 16/777,944.

USPTO, Non-Final Rejection mailed Jun. 21, 2023, in connection with parent U.S. Appl. No. 16/777,944.

USPTO, Final Rejection mailed Apr. 13, 2023, in connection with parent U.S. Appl. No. 16/777,944.

USPTO, Non-Final Rejection mailed Oct. 25, 2022, in connection with parent U.S. Appl. No. 16/777,944.

USPTO, Requirement for Restriction/Election mailed Jul. 11, 2022, in connection with parent U.S. Appl. No. 16/777,944.

MANUFACTURING METHOD FOR COMPOUND SEMICONDUCTOR DEVICE

CROSS-REFERENCE TO RELATED APPLICATION

This application is a divisional application of U.S. Ser. No. 16/777,944, filed Jan. 31, 2020, which is based upon and claims the benefit of priority of the prior Japanese Patent Application No. 2019-19110, filed on Feb. 5, 2019, the entire contents of which are incorporated herein by reference.

FIELD

The embodiments discussed herein are related to a compound semiconductor device, a manufacturing method for a compound semiconductor device, and an amplifier.

BACKGROUND

Nitride semiconductors have characteristics such as a high saturation electron velocity and a wide band gap. For this reason, various studies have been made to apply a nitride semiconductor to a compound semiconductor device having a high breakdown voltage and a high output by utilizing these characteristics. For example, the band gap of GaN, which is a kind of nitride semiconductor, is 3.4 eV, which is larger than the band gap (1.1 eV) of Si and the band gap (1.4 eV) of GaAs. Therefore, GaN has a high breakdown electric field strength and is very promising as a material for a compound semiconductor device for a power source for achieving high voltage operation and high output.

As compound semiconductor devices formed from nitride semiconductor, there have been many reports about field effect transistors, particularly high electron mobility transistors (HEMTs). For example, among GaN-based HEMTs, AlGaN/GaN-HEMTs in which GaN is used as an electron transit layer (channel layer) and AlGaN is used as an electron supply layer have been attracting attention. In AlGaN/GaN-HEMTs, distortion due to a difference in lattice constant between GaN and AlGaN occurs in AlGaN. A two-dimensional electron gas (2DEG) of high concentration is obtained by spontaneous polarization of AlGaN and piezoelectric polarization generated by the distortion. Therefore, AlGaN/GaN-HEMTs are expected as high-power devices for communication, high-efficiency switch elements, high-breakdown voltage power devices for electric vehicles and the like, and the like.

For example, Japanese Laid-open Patent Publication No. 2008-205095, Japanese Laid-open Patent Publication No. 2010-182829, and the like are disclosed as related art.

SUMMARY

According to an aspect of the embodiments, a compound semiconductor device includes a semiconductor laminate structure including an electron transit layer and an electron supply layer that are formed from compound semiconductor, a source electrode, a gate electrode, and a drain electrode that are provided above the semiconductor laminate structure and arranged in a first direction, and a first insulating film having a first internal stress and formed over the semiconductor laminate structure and between the gate electrode and the drain electrode, wherein a slit extending in the first direction is defined in the first insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In a compound semiconductor device of related art, it is difficult to improve the current density.

An object of the present disclosure is to provide a compound semiconductor device, a manufacturing method for a compound semiconductor device, and an amplifier, with which the current density may be improved.

The present inventors have made extensive studies to solve the above problems. As a result, it has been found that it is effective to improve the linearity of the electric charges in the channel.

Hereinafter, embodiments of the present disclosure will be described in detail with reference to accompanying drawings. In the specification and drawings, constituent elements having substantially the same functional configuration may be denoted by the same reference signs and redundant description thereof may be omitted.

First Embodiment

Figure 1:
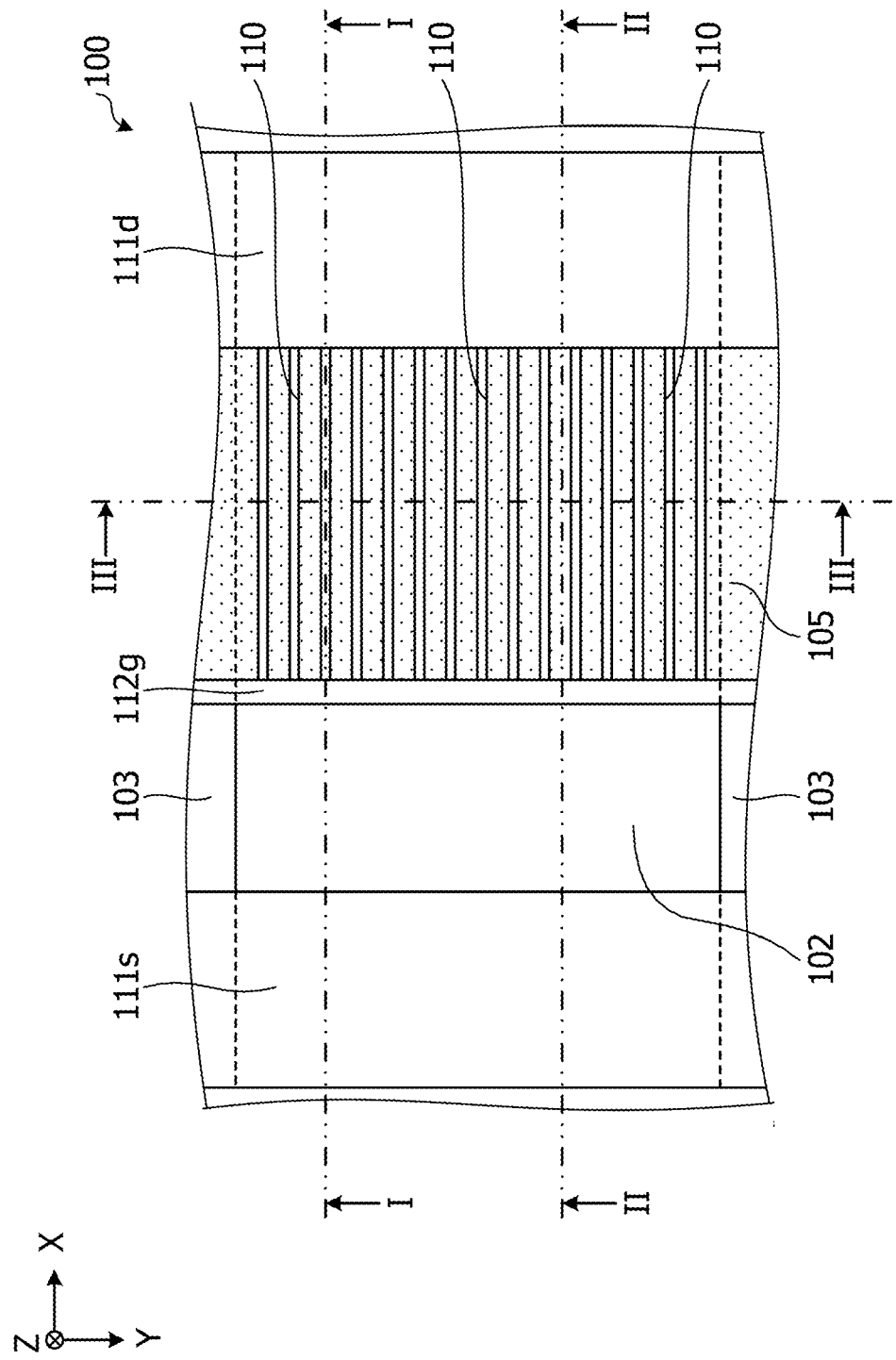
FIG. 1 is a diagram illustrating a layout of a compound semiconductor device according to a first embodiment.
Figure 2:
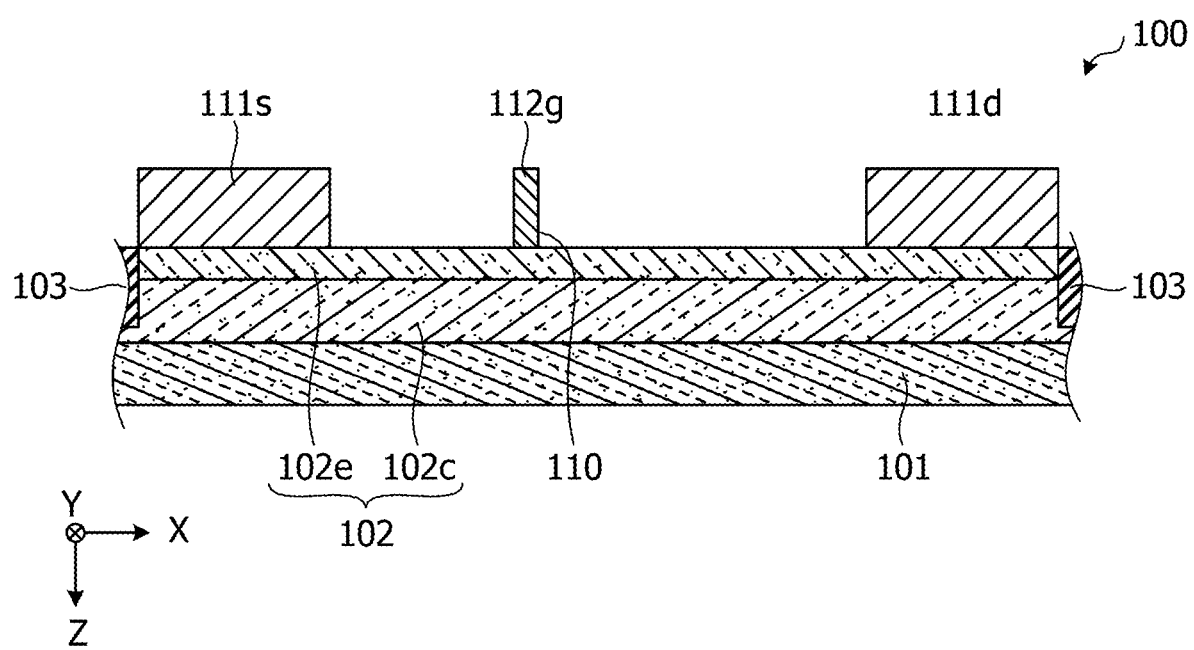
FIG. 2 is a first section view of the compound semiconductor device according to the first embodiment illustrating a structure thereof.
Figure 3:
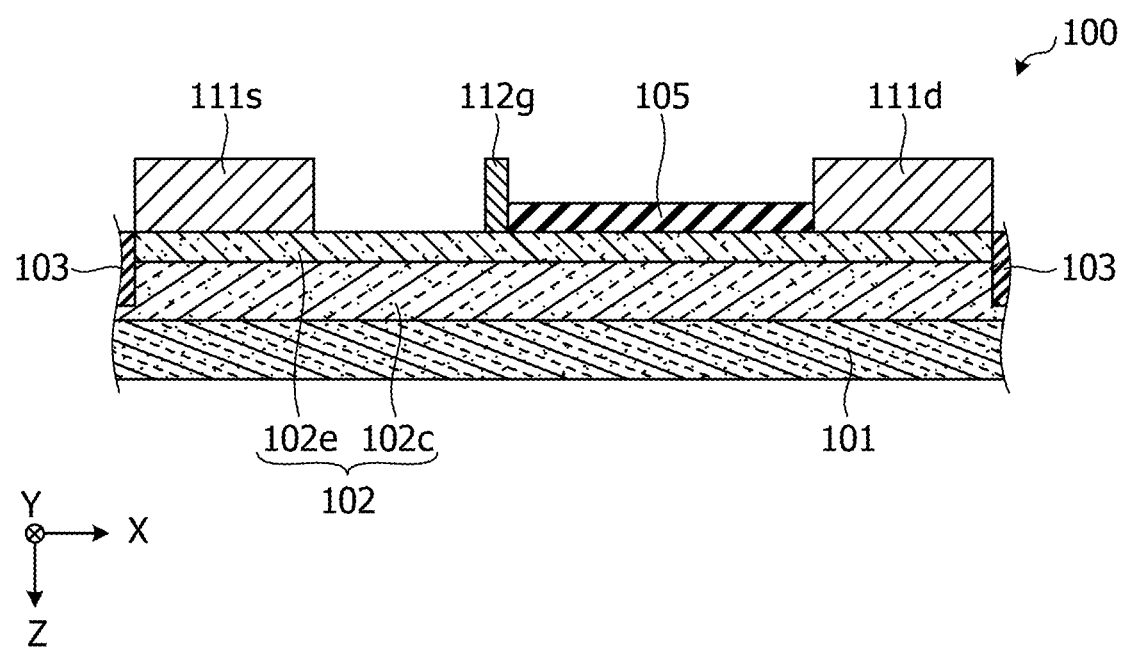
FIG. 3 is a second section view of the compound semiconductor device according to the first embodiment illustrating the structure thereof.
Figure 4:
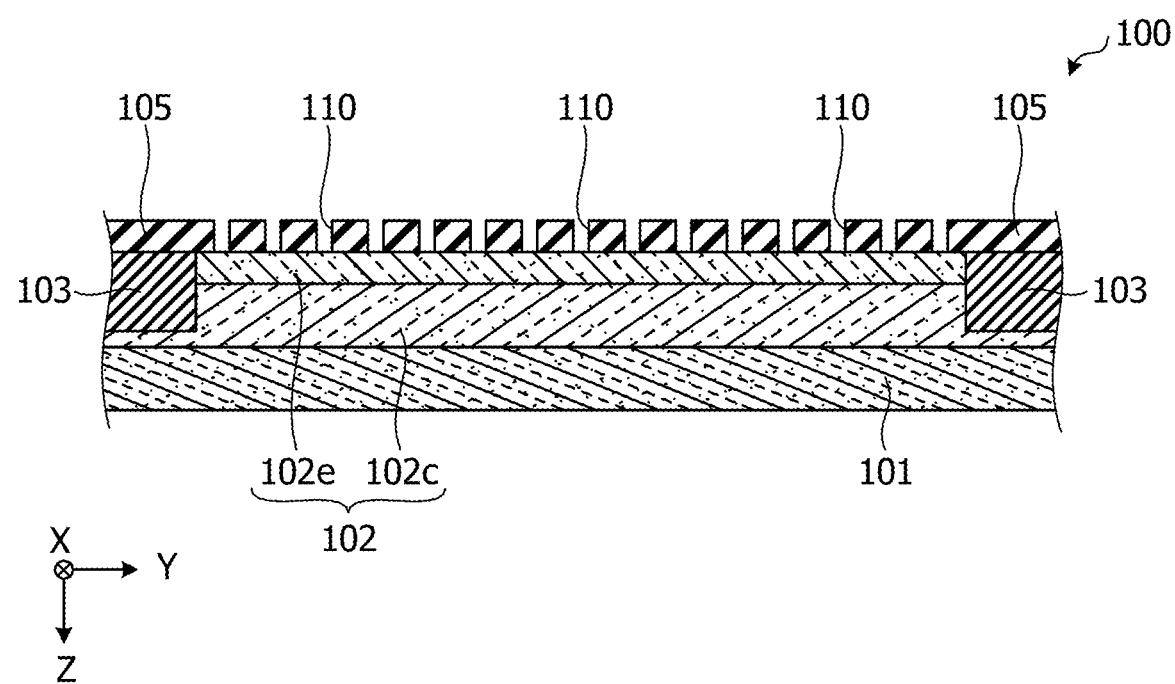
FIG. 4 is a third section view of the compound semiconductor device according to the first embodiment illustrating the structure thereof.

A first embodiment relates to a compound semiconductor device including a high electron mobility transistor (HEMT). FIG. 1 is a diagram illustrating a layout of the compound semiconductor device according to the first embodiment. FIGS. 2 to 4 are each a section view of the compound semiconductor device according to the first embodiment illustrating the structure thereof. FIG. 2 corresponds to a section view taken along a line I-I in FIG. 1, FIG. 3 corresponds to a section view taken along a line II-II in FIG. 1, and FIG. 4 corresponds to a section view taken along a line III-III in FIG. 1.

As illustrated in FIGS. 1 to 4, a compound semiconductor device 100 according to the first embodiment includes a semiconductor laminate structure 102 including an electron transit layer 102c and an electron supply layer 102e that are formed from compound semiconductor. The compound semiconductor device 100 includes a source electrode 111s, a gate electrode 112g, and a drain electrode 111d that are provided above the semiconductor laminate structure 102 and arranged in an X direction. The compound semiconductor device 100 includes a tensile stress film 105 formed over the semiconductor laminate structure 102 and between the gate electrode 112g and the drain electrode 111d. In the tensile stress film 105, a tensile stress acts within a plane (X-Y plane) parallel to the surface of the semiconductor laminate structure 102. Slits 110 extending in the X direction are defined in the tensile stress film 105. In the first embodiment, the slits 110 are defined so as to extend to the gate electrode 112g and the drain electrode 111d in the X direction. The tensile stress film 105 is an example of a first insulating film.

For example, the semiconductor laminate structure 102 is formed over the substrate 101, and the source electrode 111s, the gate electrode 112g, and the drain electrode 111d are provided within an element region defined by element separation regions 103 formed in the semiconductor laminate structure 102.

Figure 5:
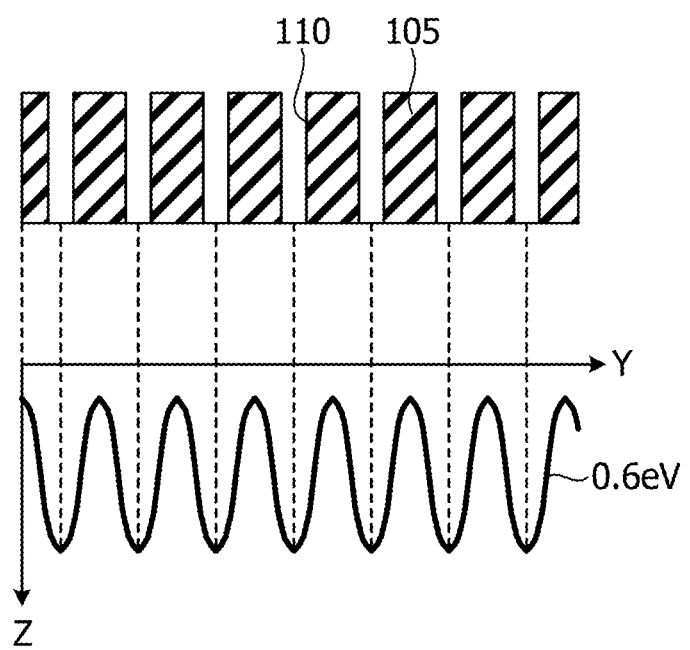
FIG. 5 is a diagram illustrating distribution of conduction band energy in the compound semiconductor device according to the first embodiment.
Figure 6:
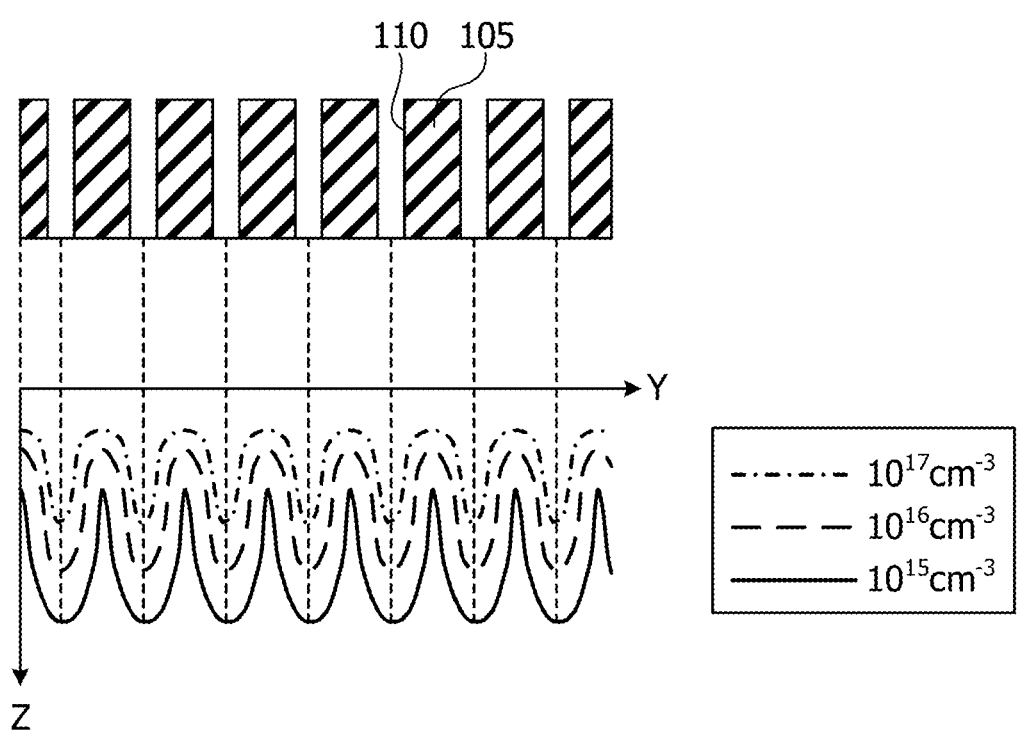
FIG. 6 is a diagram illustrating distribution of electron concentration in the compound semiconductor device according to the first embodiment.
Figure 7:
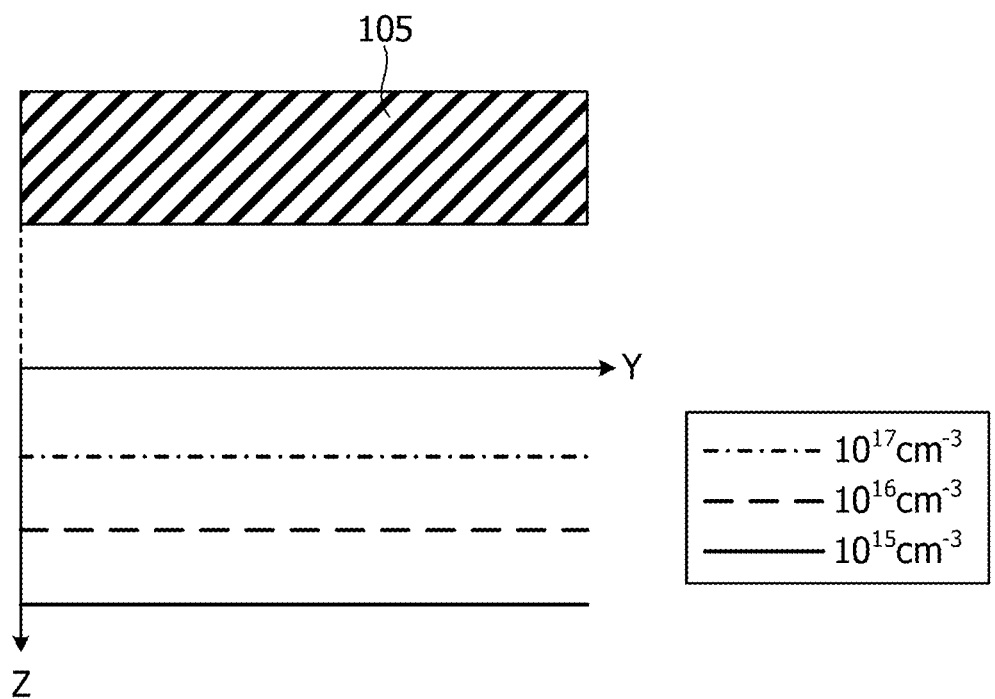
FIG. 7 is a diagram illustrating distribution of electron concentration in a compound semiconductor device of a reference example.

FIG. 5 is a diagram illustrating distribution of conduction band energy in the compound semiconductor device according to the first embodiment. FIG. 6 is a diagram illustrating distribution of electron concentration in the compound semiconductor device according to the first embodiment. FIG. 7 is a diagram illustrating distribution of electron concentration in the compound semiconductor device of a reference example. FIG. 5 illustrates distribution of depth from the surface of the semiconductor laminate structure 102 where the energy of the conduction band is 0.6 eV, in a Y direction parallel to the surface of the semiconductor laminate structure 102 and perpendicular to the X direction. FIGS. 6 and 7 illustrate distribution of depth from the surface of the semiconductor laminate structure 102 in the Y direction where the electron concentration is $10^{15}$ cm$^{-3}$, $10^{16}$ cm$^{-3}$, or $10^{17}$ cm$^{-3}$.

As illustrated in FIG. 5, between the gate electrode 112g and the drain electrode 111d, the energy of the conduction band in regions overlapping the slits 110 is lower than the energy of the conduction band in regions covered by the tensile stress film 105. Therefore, quantum wells of conduction band energy are present in the regions overlapping the slits 110. Therefore, as illustrated in FIG. 6, electrons are confined in the Y direction and quantized. This quantization improves the linearity of electrons in the channel, suppresses scattering of electrons in the Y direction, and suppresses change in the momentum in the Y direction. As a result, saturation of drain current may be suppressed, and the current density may be improved.

In contrast, in a reference example in which the slits 110 are not defined in the tensile stress film 105, no quantum well is present. Therefore, as illustrated in FIG. 7, electrons are not confined in the Y direction, and while the electrons are moved between the source and the drain by an electric field, the electrons are more likely to scatter in the Y direction than in the first embodiment.

As described above, according to the compound semiconductor device 100, the current density may be improved. By using the compound semiconductor device 100 for an amplifier, the output may be improved.

The material of the tensile stress film 105 is not limited. For example, silicon nitride (SiN), magnesium oxide (MgO), or the like may be used for the tensile stress film 105. The depth of the quantum wells of the conduction band associated with the definition of the slits 110 is approximately proportional to the tensile stress of the tensile stress film 105. The magnitude of the tensile stress of the tensile stress film 105 is not limited, but is, for example, 1 GPa to 20 GPa.

The width of each of the slits 110 is not limited, but is preferably 100 nm or less from the viewpoint of confining electrons in the Y direction. If the width is too large, an excellent confinement effect may not be obtained. The width of each of the slits 110 is preferably 10 nm or more from the viewpoint of processing accuracy. If the width is too small, it may be difficult to define the slits 110 with high accuracy.

The plurality of slits 110 are not necessarily arranged at equal intervals in the Y direction. For example, the slits 110 may be sparse at the center and dense at both ends in the gate width direction. In this case, current flows more easily in the vicinity of both ends than in the center in the gate width direction, and thus heat generated by the operation of the compound semiconductor device 100 is easily dissipated to the outside.

When an internal stress film having internal stress is formed over a silicon substrate, the silicon substrate is deformed in response to internal stress from the internal stress film, and exhibits curvature. When the thickness of the silicon substrate is h (m), the radius of curvature of the silicon substrate is r (m), and the thickness of the internal stress film is t (m), the internal stress s (Pa) of the internal stress film may be expressed by the following formula (1). If s is a positive value, the internal stress film is a tensile stress film having internal stress of tensile force, and if s is a negative value, the internal stress film is a compressive stress film having compressive stress. $s = 1.805 \times 10^{11} \times h^2 / 6rt$ . . . (1)

The material of the semiconductor laminate structure 102 is not limited. For example, GaN may be used for the electron transit layer 102c, and $Al_xGa_{1-x}N$ (0<x≤1) may be used for the electron supply layer 102e. The thickness of the electron transit layer 102c and the thickness of the electron supply layer 102e are not limited. However, as the electron supply layer 102e becomes thicker, the tensile stress of the tensile stress film 105 becomes less likely to act on the channel, and the confinement effect of electrons becomes weaker. From the viewpoint of the influence of the tensile stress, the thickness of the electron supply layer 102e is preferably 10 nm or less. Furthermore, in order to generate a two-dimensional electron gas (2DEG) of a sufficient concentration, Al composition x of $Al_xGa_{1-x}N$ is preferably 0.32 or more, more preferably 0.50 or more, and further preferably 1.00. That is, preferably 32% or more, more preferably 50% or more, and further preferably 100% of metal atoms in the nitride ($Al_xGa_{1-x}N$) are Al. The concentration of the 2DEG is not limited, but is preferably $2 \times 10^{13}$ cm$^{-2}$ or higher. By increasing the Al composition x, the quantum wells are formed also in the Z direction, thereby making it easier to confine electrons. InAlN or InAlGaN may be used for the electron supply layer 102e.

In the case of using AlN for the electron supply layer 102e, it is preferable that a recess for source and a recess for drain are defined in the semiconductor laminate structure 102, a low resistance re-grown layer such as n$^+$ GaN is formed in the recesses, and the source electrode 111s and the drain electrode 111d are formed over the re-grown layer.

Second Embodiment

Figure 8:
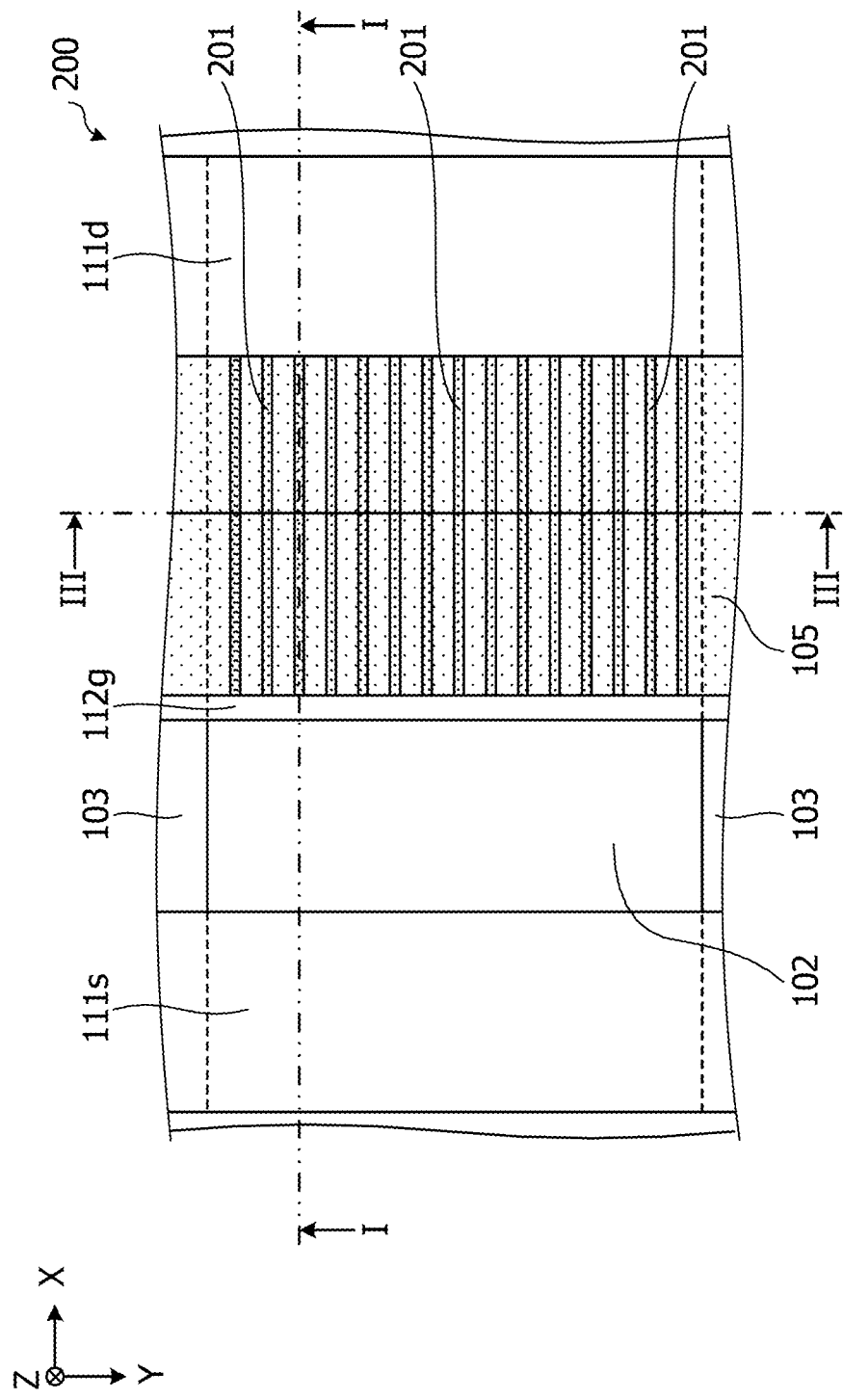
FIG. 8 is a diagram illustrating a layout of a compound semiconductor device according to a second embodiment.
Figure 9:
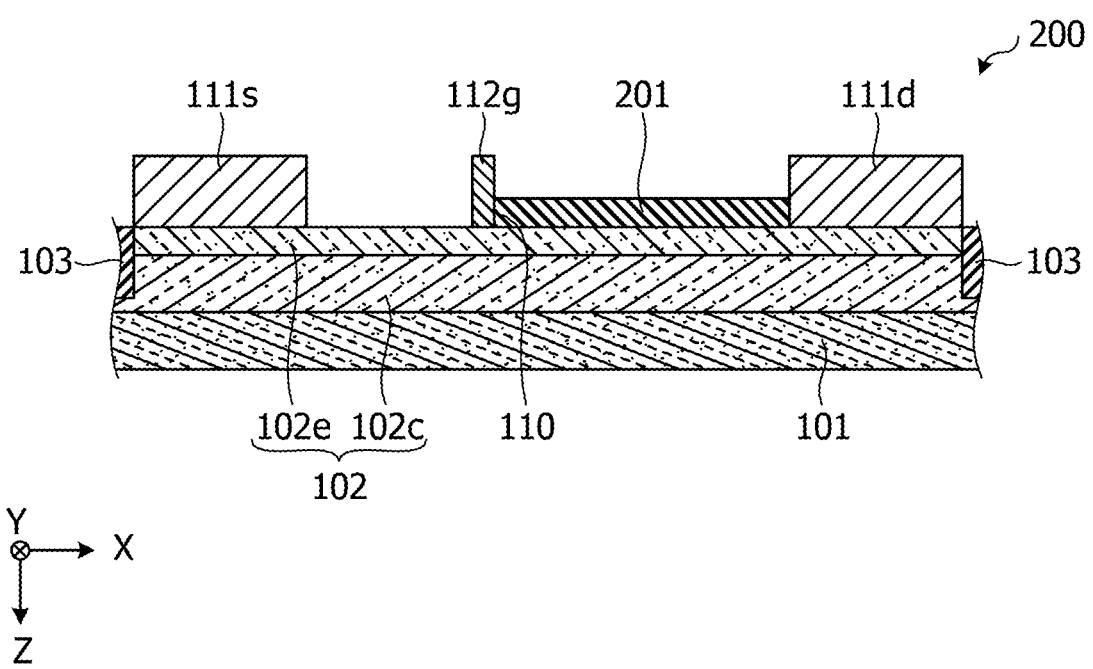
FIG. 9 is a first section view of the compound semiconductor device according to the second embodiment illustrating a structure thereof.
Figure 10:
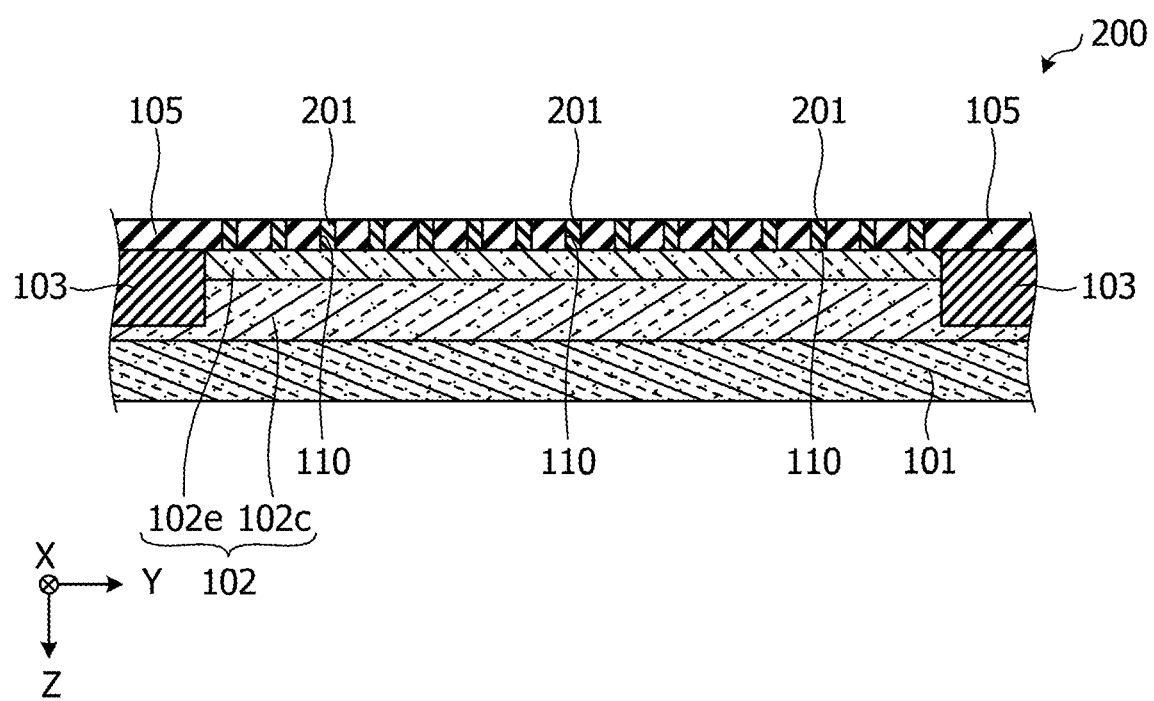
FIG. 10 is a second section view of the compound semiconductor device according to the second embodiment illustrating a structure thereof.

A second embodiment relates to a compound semiconductor device including an HEMT. FIG. 8 is a diagram illustrating a layout of the compound semiconductor device according to the second embodiment. FIGS. 9 and 10 are each a section view of the compound semiconductor device according to the second embodiment illustrating the structure thereof. FIG. 9 corresponds to a section view taken along a line I-I in FIG. 8, and FIG. 10 corresponds to a section view taken along a line III-III in FIG. 8.

As illustrated in FIGS. 8 to 10, a compound semiconductor device 200 according to the second embodiment includes a compressive stress film 201 formed in the slits 110. In the compressive stress film 201, a compressive stress acts within a plane (X-Y plane) parallel to the surface of the semiconductor laminate structure 102. The compressive stress film 201 is an example of a second insulating film. The other elements are the same as in the first embodiment.

In the compound semiconductor device 200, the quantum wells present in the regions overlapping the slits 110 are deeper. Therefore, according to the compound semiconductor device 200, the linearity of electrons in the channel may be further improved and the current density may be further improved.

From another perspective, by combining the tensile stress film 105 having a tensile stress of 5 GPa and the compressive stress film 201 having a compressive stress of 5 GPa, quantum wells similar to the case of using the tensile stress film 105 having a tensile stress of 10 GPa in the first embodiment. Although the film forming conditions of films having larger internal stress are more restrictive, the flexibility of the film forming conditions may be improved according to the second embodiment.

Third Embodiment

Figure 11:
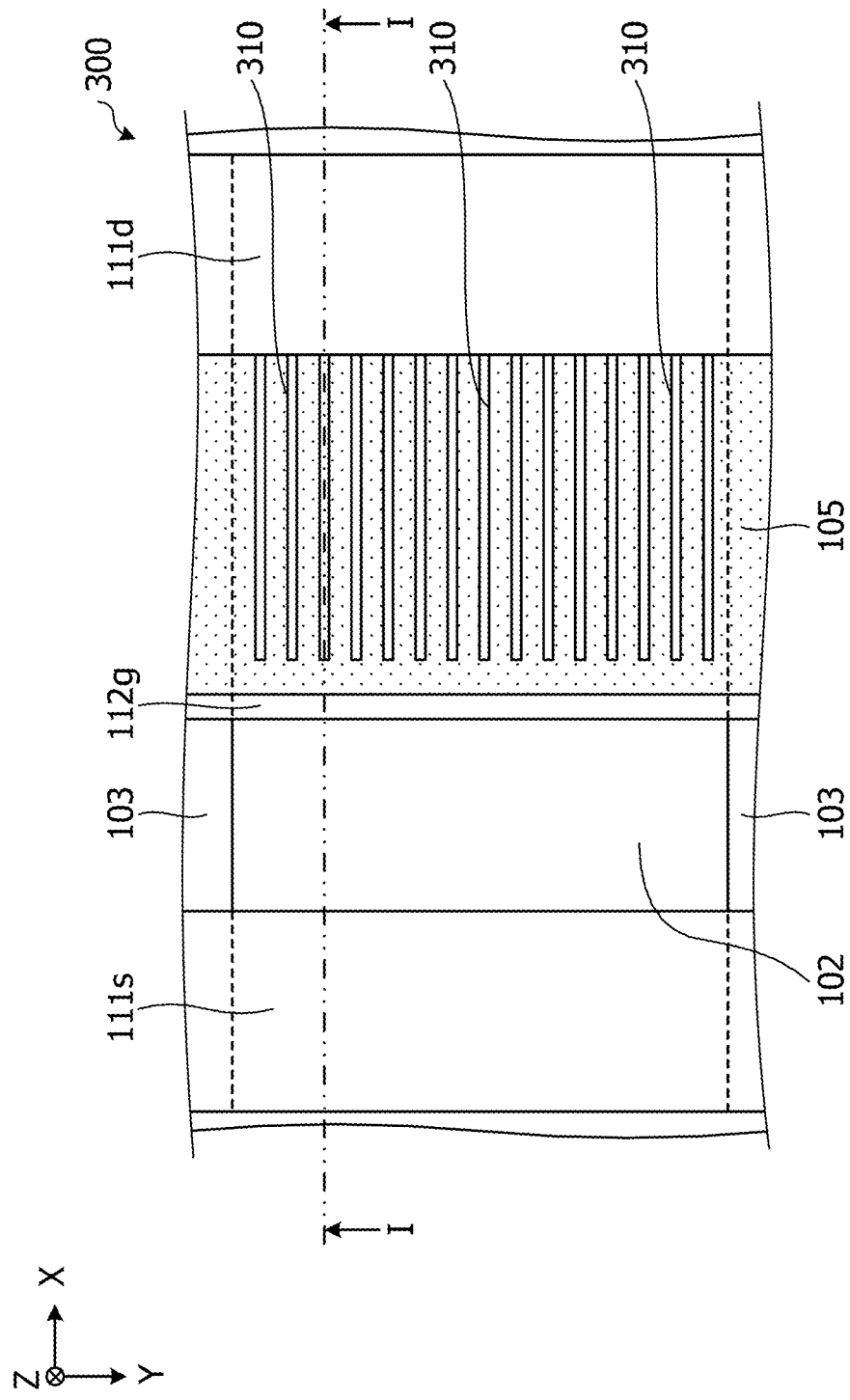
FIG. 11 is a diagram illustrating a layout of a compound semiconductor device according to a third embodiment.
Figure 12:
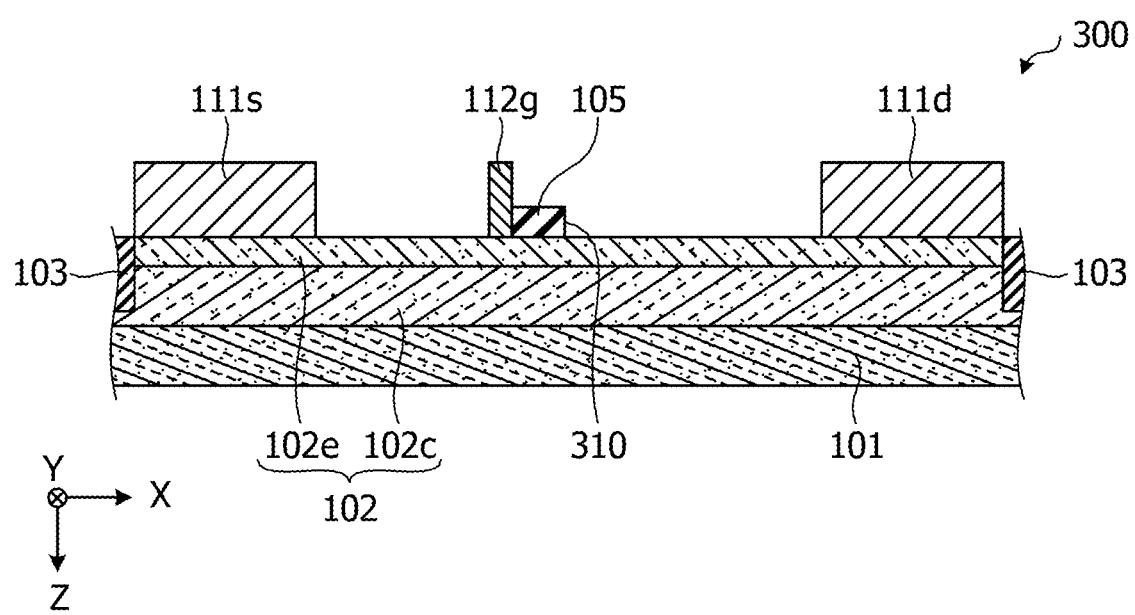
FIG. 12 is a section view of the compound semiconductor device according to the third embodiment illustrating a structure thereof.

A third embodiment relates to a compound semiconductor device including an HEMT. FIG. 11 is a diagram illustrating a layout of the compound semiconductor device according to the third embodiment. FIG. 12 is a section view of the compound semiconductor device according to the third embodiment illustrating a structure thereof. FIG. 12 corresponds to a section view taken along a line I-I in FIG. 11.

In a compound semiconductor device 300 according to the third embodiment, as illustrated in FIGS. 11 and 12, slits 310 are defined in the tensile stress film 105 instead of the slits 110. The slits 310 are defined so as to extend to the drain electrode 111d but be spaced apart from the gate electrode 112g in the X direction. The other elements are the same as in the first embodiment.

As described above, quantum wells are present in the regions overlapping the slits 110, and electrons are accumulated therein. In the compound semiconductor device 100 according to the first embodiment, the slits 110 are defined so as to extend to the gate electrode 112g in the X direction. In contrast, in the compound semiconductor device 300 according to the third embodiment, the end portions of the slits 310 on the gate electrode 112g side are spaced apart from the gate electrode 112g in the X direction. Therefore, according to the compound semiconductor device 300, the gate leakage current derived from accumulation of electrons in the regions overlapping the slits 310 may be reduced more than the gate leakage current derived from accumulation of electrons in the regions overlapping the slits 110 in the compound semiconductor device 100.

The distance from the end portions of the slits 310 on the gate electrode 112g side to the gate electrode 112g in the X direction is not limited, but is preferably 0.2 μm or more from the viewpoint of effectively reducing the gate leakage current.

As in the second embodiment, the compressive stress film 201 may be formed in the slits 310. Also in this case, the effect of reducing the gate leakage current may be obtained.

Fourth Embodiment

Figure 13:
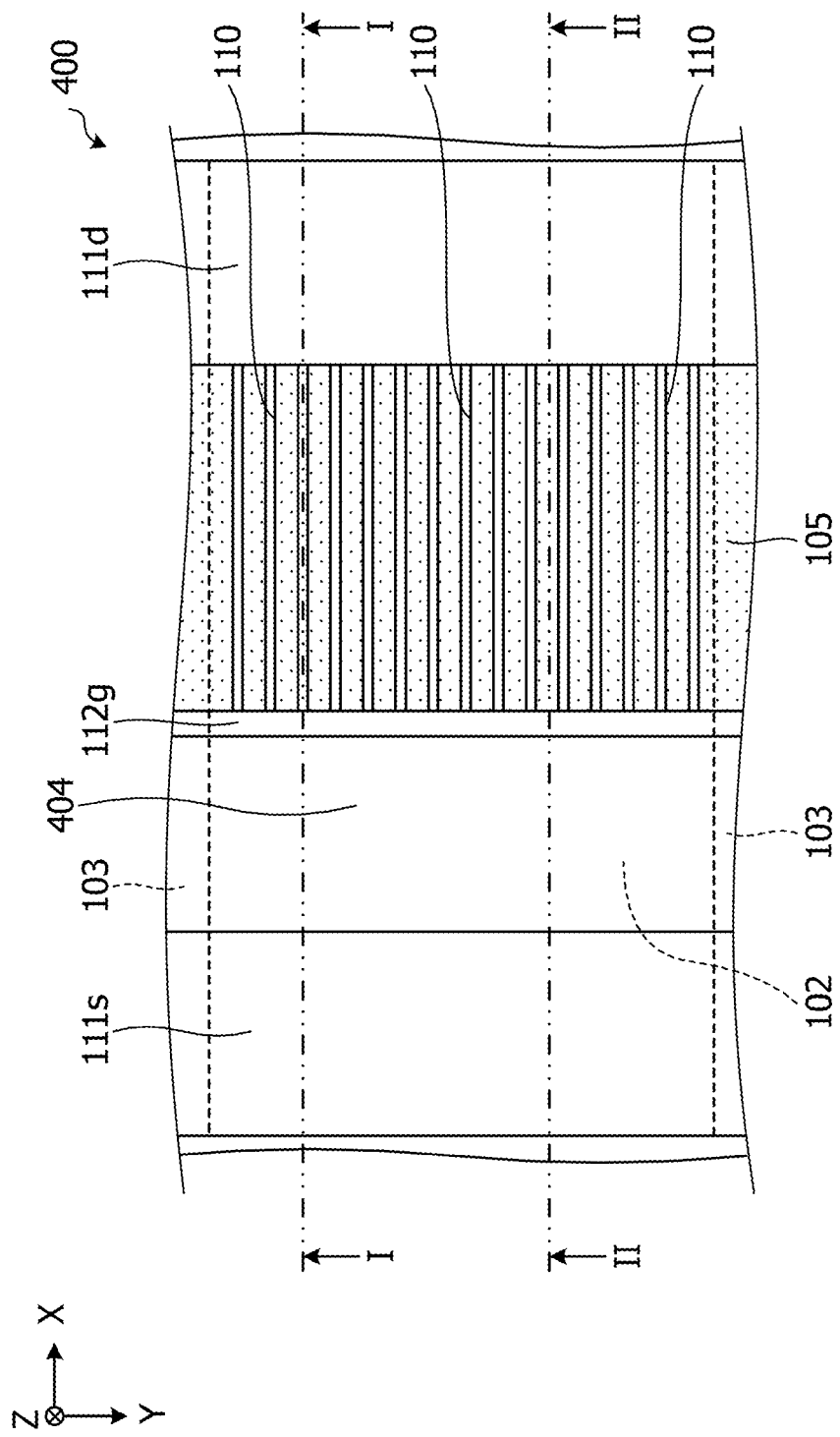
FIG. 13 is a diagram illustrating a layout of a compound semiconductor device according to a fourth embodiment.
Figure 14:
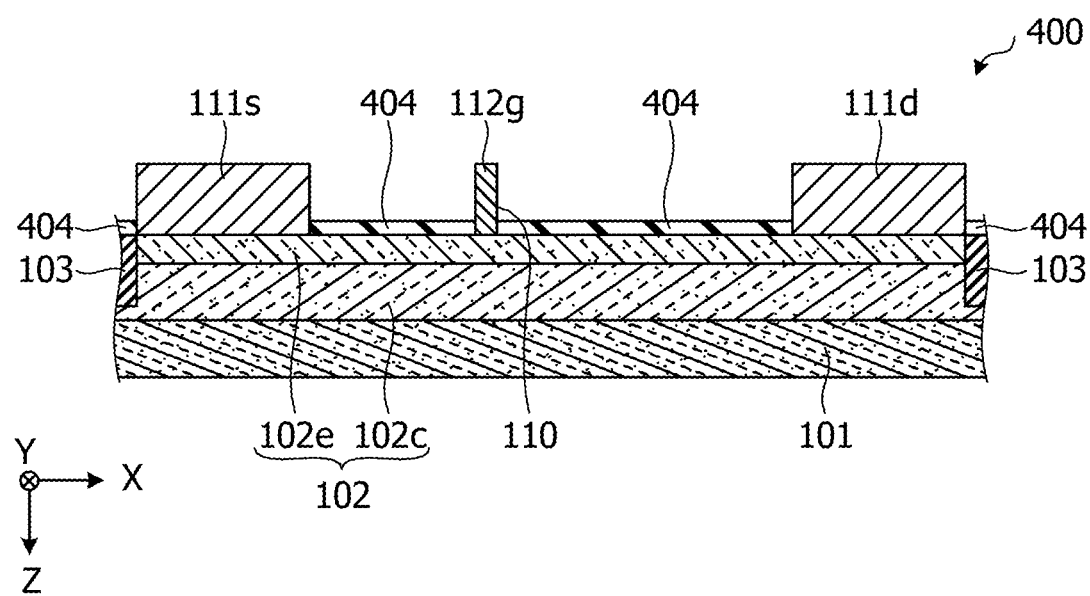
FIG. 14 is a first section view of the compound semiconductor device according to the fourth embodiment illustrating a structure thereof.
Figure 15:
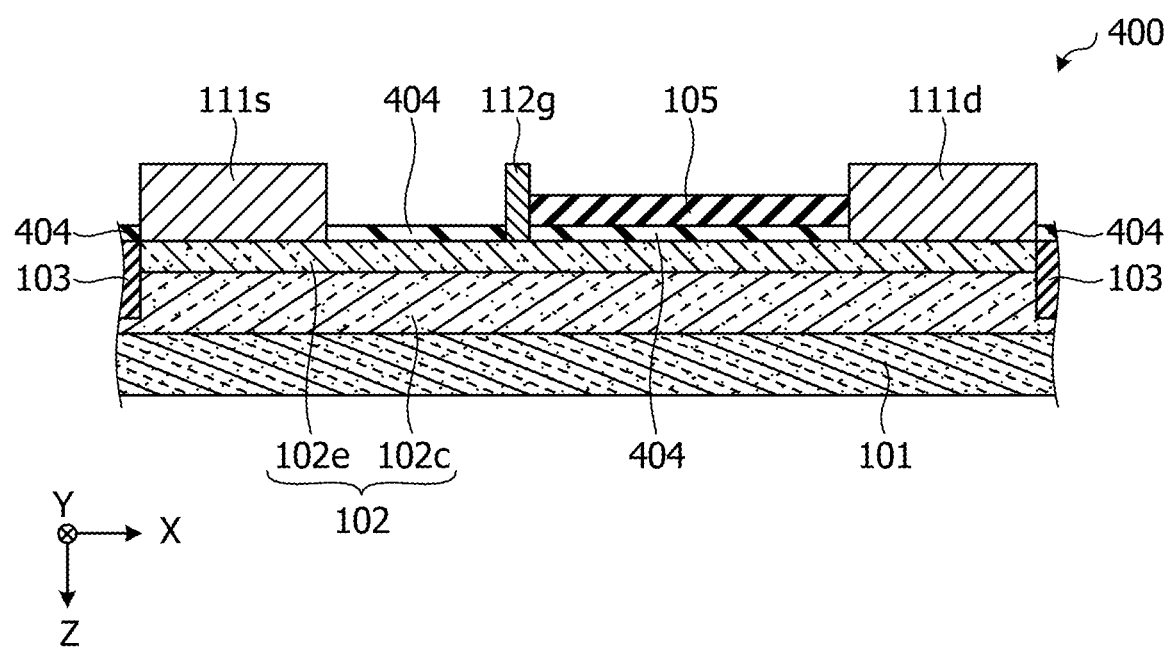
FIG. 15 is a second section view of the compound semiconductor device according to the fourth embodiment illustrating a structure thereof.

A fourth embodiment relates to a compound semiconductor device including an HEMT. FIG. 13 is a diagram illustrating a layout of the compound semiconductor device according to the fourth embodiment. FIGS. 14 and 15 are each a section view of the compound semiconductor device according to the fourth embodiment illustrating the structure thereof. FIG. 14 corresponds to a section view taken along a line I-I in FIG. 13, and FIG. 15 corresponds to a section view taken along a line II-II in FIG. 13.

As illustrated in FIGS. 13 to 15, the compound semiconductor device 400 according to the fourth embodiment includes a protective film 404 formed over the semiconductor laminate structure 102, and the tensile stress film 105 is formed over the protective film 404. The protective film 404 is, for example, a silicon nitride film that does not have internal stress. The other elements are the same as in the first embodiment.

Although a method of forming the tensile stress film 105 is not limited, the tensile stress film 105 may be sometimes formed under a condition in which damage to a layer thereunder is likely to occur. In the compound semiconductor device 100 according to the first embodiment, the object to be damaged is mainly the semiconductor laminate structure 102, whereas in the compound semiconductor device 400 according to the fourth embodiment, the object to be damaged is mainly the protective film 404. Therefore, the influence of damage to the channel may be reduced.

From another viewpoint, a film which is preferable in view of tensile stress but is not preferable in the first embodiment in view of the damage may be used as the tensile stress film 105. That is, it is possible to expand the range of types of film which may be suitably used for the tensile stress film 105.

The material of the protective film 404 is not limited. For example, silicon nitride, polyimide, or the like may be used for the protective film 404. When the Young's modulus of the protective film 404 is too high, tensile stress of the tensile stress film 105 becomes less likely to act on the channel. The Young's modulus of the protective film 404 is preferably 220 GPa or less, more preferably 200 GPa or less, and further preferably 100 GPa or less from the viewpoint of the influence of the tensile stress. The Young's modulus of silicon nitride is about 200 GPa, and the Young's modulus of polyimide is about 10 GPa to 100 GPa. It is preferable that the internal stress of the protective film 404 itself is smaller, and for example, the absolute value of the internal stress is preferably 300 MPa or less, regardless of whether the internal stress is tensile stress or compressive stress.

Experiments carried out by the present inventors have confirmed the following effects of the protective film. As a result of forming a laminate of a GaN layer and an AlGaN layer and measuring the mobility of the two-dimensional electron gas, a mobility of about 2200 $cm^2/V \cdot s$ was obtained. When a tensile stress film was formed over the AlGaN layer without forming a protective film, the mobility was reduced to about 1000 $m^2/V \cdot s$ to 1050 $m^2/V \cdot s$. In contrast, when a protective film was formed over the AlGaN layer and a tensile stress film was formed over the protective film, a mobility of about 2110 $m^2/V \cdot s$ was obtained.

The protective film 404 may also be formed between the gate electrode 112g and the semiconductor laminate structure 102. In this configuration, a part of the protective film 404 may be used as a gate insulating film. According to this configuration, as compared with the configuration in which the gate insulating film is formed in addition to the protective film 404, the number of interfaces between films of different kinds in the vicinity of the gate electrode 112g is small, and therefore transient response due to interface trap may be reduced.

The protective film 404 may be included in the second embodiment and the third embodiment.

Fifth Embodiment

Figure 16:
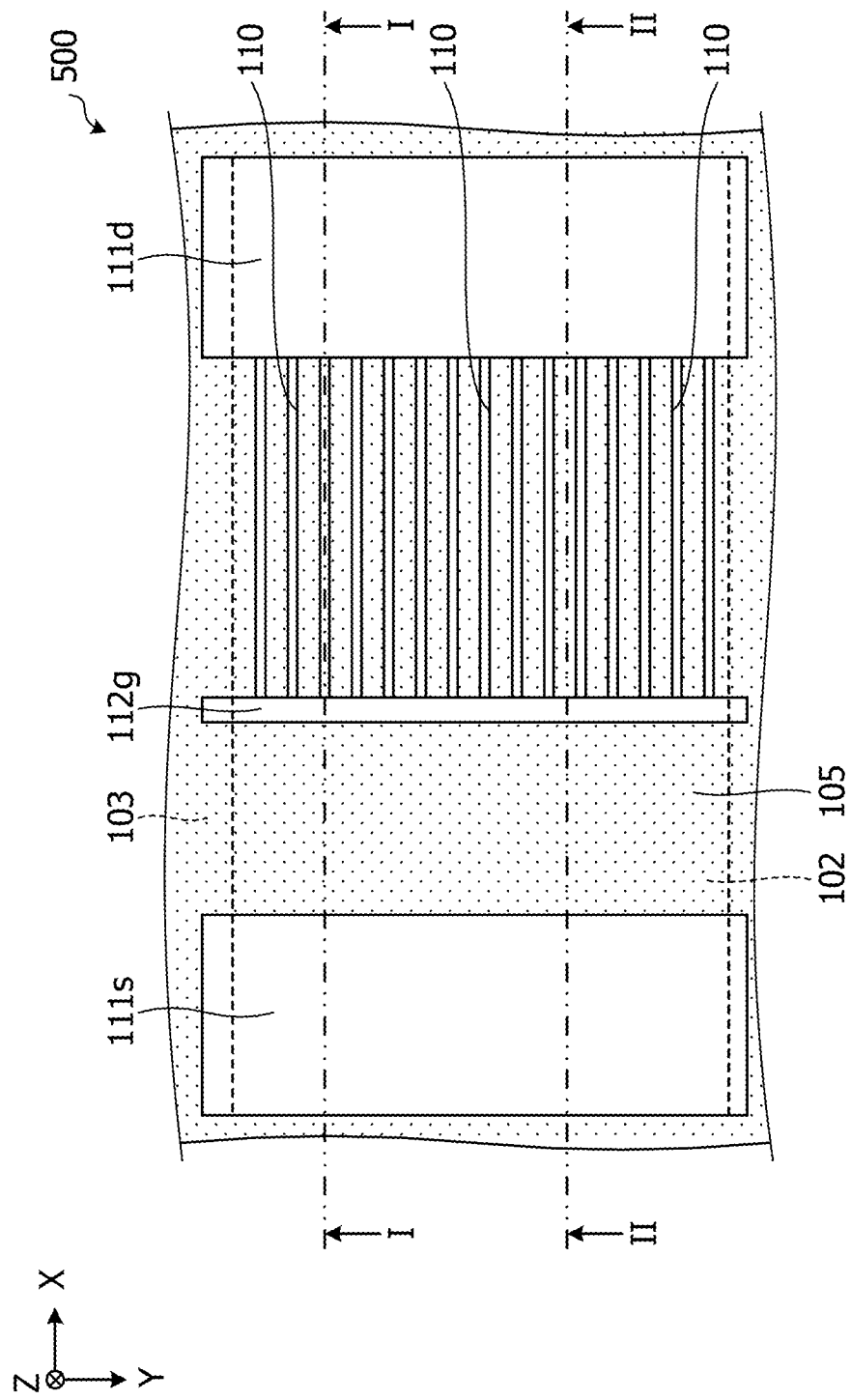
FIG. 16 is a diagram illustrating a layout of a compound semiconductor device according to a fifth embodiment.
Figure 17:
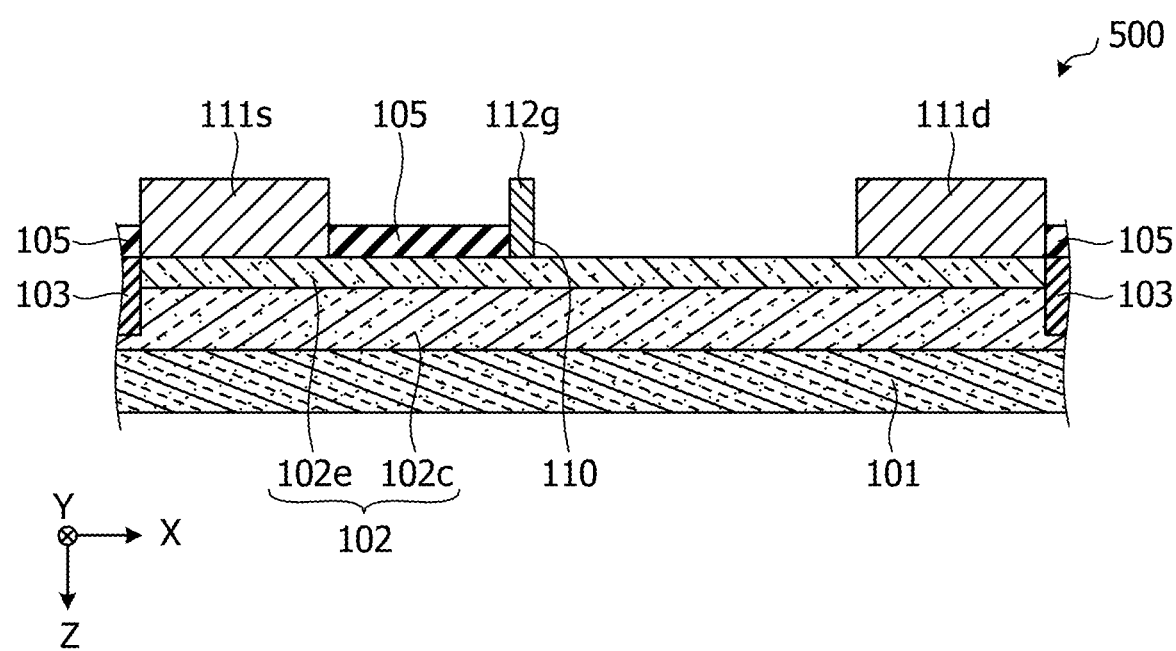
FIG. 17 is a first section view of the compound semiconductor device according to the fifth embodiment illustrating a structure thereof.
Figure 18:
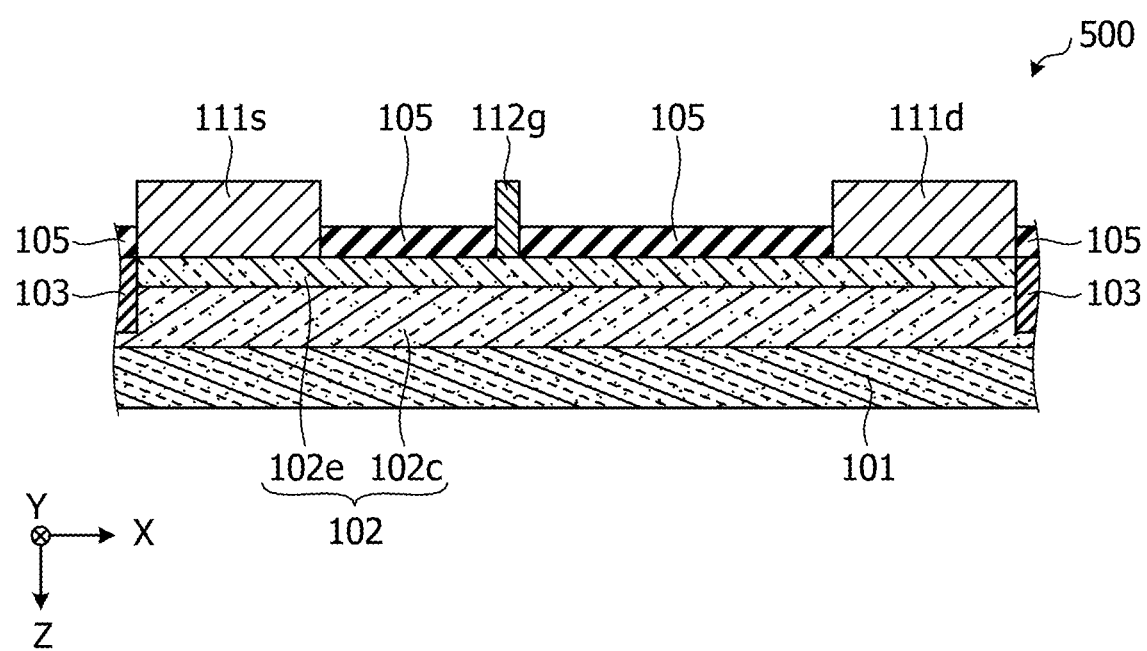
FIG. 18 is a second section view of the compound semiconductor device according to the fifth embodiment illustrating a structure thereof.

A fifth embodiment relates to a compound semiconductor device including an HEMT. FIG. 16 is a diagram illustrating a layout of the compound semiconductor device according to the fifth embodiment. FIGS. 17 and 18 are each a section view of the compound semiconductor device according to the fifth embodiment illustrating the structure thereof. FIG. 17 corresponds to a section view taken along a line I-I in FIG. 16, and FIG. 18 corresponds to a section view taken along a line II-II in FIG. 16.

In a compound semiconductor device 500 according to the fifth embodiment, as illustrated in FIGS. 16 to 18, the tensile stress film 105 is formed not only between the gate electrode 112g and the drain electrode 111d but also between the gate electrode 112g and the source electrode 111s, and so forth. The other elements are the same as in the first embodiment.

According to the compound semiconductor device 500 of the fifth embodiment, the current density may be improved similarly to the compound semiconductor device 100.

In the second to fourth embodiments, the tensile stress film 105 may be formed not only between the gate electrode 112g and the drain electrode 111d but also between the gate electrode 112g and the source electrode 111s, and so forth.

Sixth Embodiment

Figure 19:
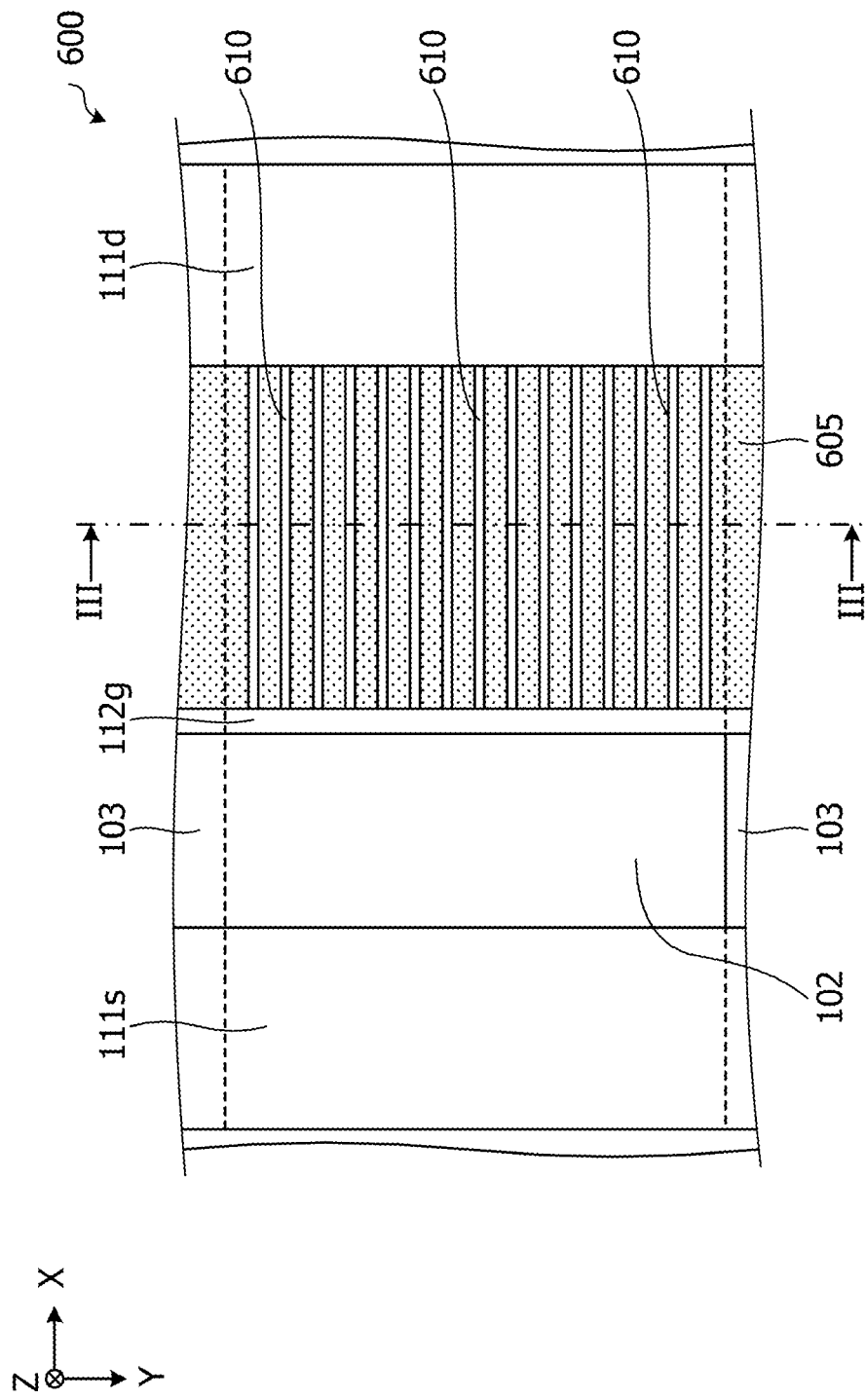
FIG. 19 is a diagram illustrating a layout of a compound semiconductor device according to a sixth embodiment.

A sixth embodiment relates to a compound semiconductor device including an HEMT. FIG. 19 is a diagram illustrating a layout of the compound semiconductor device according to the sixth embodiment.

As illustrated in FIG. 19, a compound semiconductor device 600 according to the sixth embodiment includes a compressive stress film 605 instead of the tensile stress film 105. Slits 610 extending in the X direction are defined in the compressive stress film 605. In the sixth embodiment, the slits 610 are defined so as to extend to the gate electrode 112g and the drain electrode 111d in the X direction. The compressive stress film 605 is an example of a first insulating film. The other elements are the same as in the first embodiment.

Figure 20:
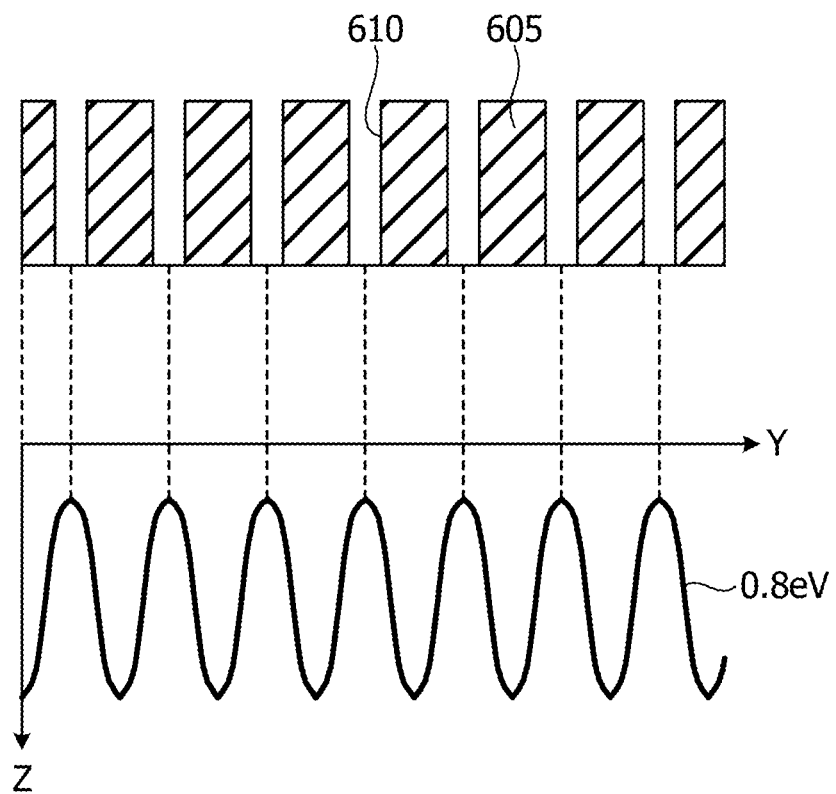
FIG. 20 is a diagram illustrating distribution of conduction bands in the compound semiconductor device according to the sixth embodiment.

FIG. 20 is a diagram illustrating distribution of conduction bands in the compound semiconductor device according to the sixth embodiment; FIG. 20 illustrates the distribution of the depth from the surface of the semiconductor laminate structure 102 in which the energy of the conduction band is 0.8 eV in the Y direction parallel to the surface of the semiconductor laminate structure 102 and perpendicular to the X direction.

As illustrated in FIG. 20, between the gate electrode 112g and the drain electrode 111d, the energy of the conduction band in regions overlapping the slits 610 is lower than the energy of the conduction band in regions covered by the compressive stress film 605. Accordingly, quantum wells are present in the regions covered by the compressive stress film 605. Therefore, electrons are confined in the Y direction and quantized. This quantization improves the linearity of electrons in the channel, suppresses scattering of electrons in the Y direction, and suppresses change in the momentum in the Y direction. As a result, saturation of drain current may be suppressed, and the current density may be improved.

In the second to fifth embodiment, the compressive stress film 605 may be formed instead of the tensile stress film 105.

Seventh Embodiment

Figure 21A:
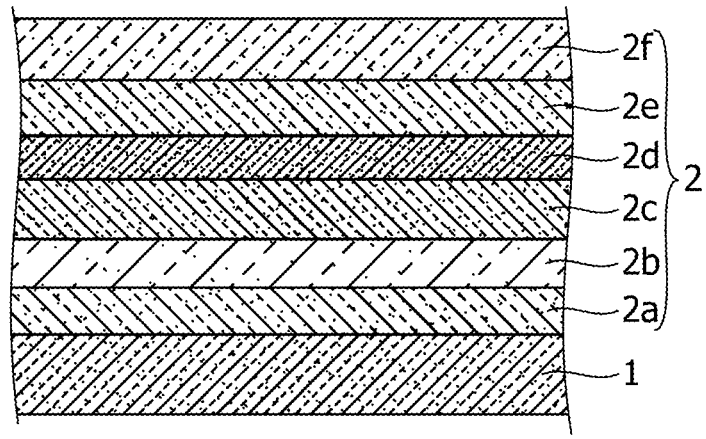
FIG. 21A is a first section view illustrating a manufacturing method for a compound semiconductor device according to a seventh embodiment.

A seventh embodiment relates to a manufacturing method for a compound semiconductor device including an HEMT. FIGS. 21A to 21N, 22A, and 22B are each a section view illustrating the manufacturing method for the compound semiconductor device according to the seventh embodiment. FIGS. 21A to 21N each illustrate a section perpendicular to the Y direction, and FIGS. 22A and 22B each illustrate a section perpendicular to the X direction.

First, as illustrated in FIG. 21A, a nucleation layer 2a, a buffer layer 2b, an electron transit layer 2c, an intermediate layer 2d, an electron supply layer (barrier layer) 2e, and a cap layer 2f are epitaxially grown over a substrate 1 such as a semi-insulating SiC substrate by, for example, an organic metal vapor phase epitaxy (MOVPE) method. The nucleation layer 2a, the buffer layer 2b, the electron transit layer 2c, the intermediate layer 2d, the electron supply layer 2e, and the cap layer 2f are included in a semiconductor laminate structure 2.

As the nucleation layer 2a, for example, an AlN layer is formed. As the buffer layer 2b, for example, an AlGaN layer is formed. As the electron transit layer 2c, for example, a GaN layer (i-GaN layer) not having undergone intentional doping with impurities is formed. As the intermediate layer 2d, for example, an AlN layer is formed. As the electron supply layer 2e, for example, an AlGaN layer is formed. As the cap layer 2f, for example, a GaN layer is formed.

For the formation of the semiconductor laminate structure 2, for example, a mixed gas of trimethylaluminum (TMA) gas serving as an Al source, a trimethylgallium (TMG) gas serving as a Ga source, and an ammonia ($NH_3$) gas serving as a N source is used. At this time, whether or not to supply the trimethylaluminum gas and the trimethylgallium gas and the flow rate thereof are appropriately set in accordance with the composition of the compound semiconductor layer to be grown. The intermediate layer 2d between the electron transit layer 2c and the electron supply layer 2e may be formed if necessary. The cap layer 2f may be also formed if necessary.

Figure 21B:
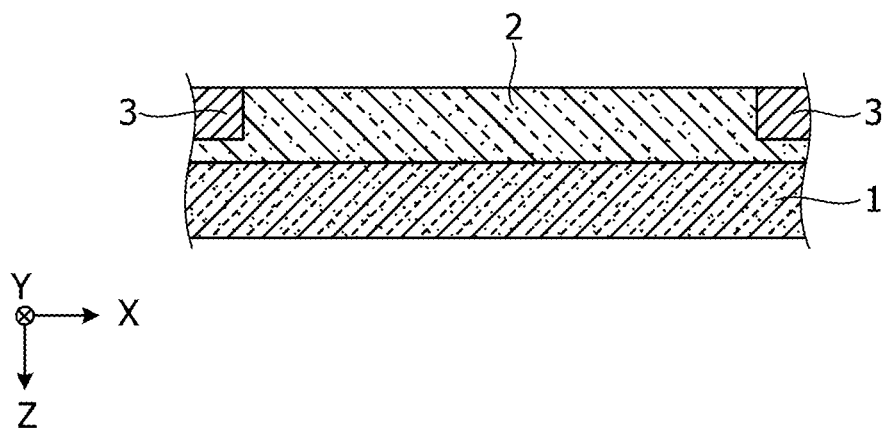
FIG. 21B is a second section view illustrating the manufacturing method for the compound semiconductor device according to the seventh embodiment.

Next, as illustrated in FIG. 21B, element separation regions 3 defining an element region is formed in the semiconductor laminate structure 2. In the formation of the element separation regions 3, for example, a photoresist pattern that exposes regions where the element separation regions 3 are to be formed is formed over the semiconductor laminate structure 2, and ion injection of Ar or the like is performed by using this pattern as a mask. Dry etching may be performed with a chlorine-based gas by using this pattern as an etching mask. The element separation regions 3 may be formed to be also present in the substrate 1.

Figure 21C:
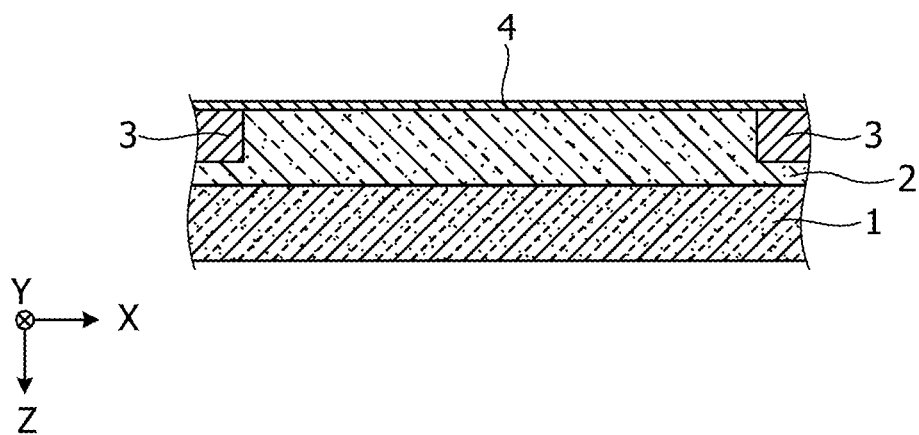
FIG. 21C is a third section view illustrating the manufacturing method for the compound semiconductor device according to the seventh embodiment.

Thereafter, as illustrated in FIG. 21C, a protective film 4 is formed over the semiconductor laminate structure 2. As the protective film 4, for example, a silicon nitride (SiN) film having a thickness of 10 nm to 30 nm is formed. The protective film 4 may be formed by, for example, a plasma chemical vapor deposition (CVD) method using $SiH_4$ and $NH_3$ as raw material gases.

Figure 21D:
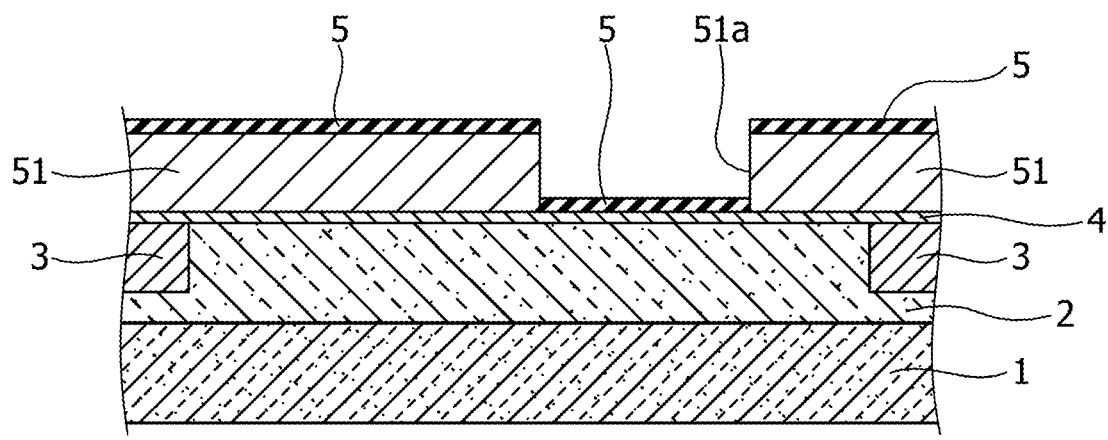
FIG. 21D is a fourth section view illustrating the manufacturing method for the compound semiconductor device according to the seventh embodiment.
Figure 21D:
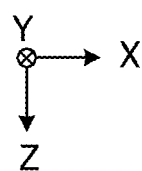

Subsequently, as illustrated in FIG. 21D, a resist pattern 51 having an opening portion 51a is formed over the protective film 4 between the region where the gate electrode is to be formed and the region where the drain electrode is to be formed. At this time, it is preferable that an end portion of the opening portion 51a on the side on which the region where the gate electrode is to be formed is spaced apart by 0.2 μm or more from the region where the gate electrode is to be formed. Then, a tensile stress film 5 is formed over the protective film 4 inside the opening portion 51a. In the formation of the tensile stress film 5, for example, a magnesium oxide (MgO) film having a thickness of 50 nm to 200 nm is formed by a sputtering method, and the magnesium oxide is heated to generate a tensile stress therein. In the heating, for example, the temperature is held at 750° C. to 900° C. for 30 seconds to 2 minutes. The tensile stress film 5 is also formed over the resist pattern 51.

Figure 21E:
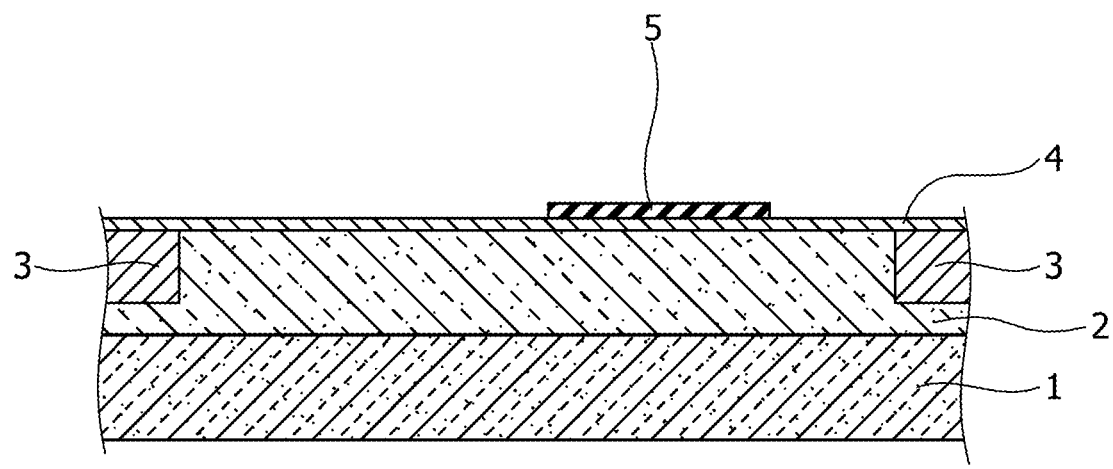
FIG. 21E is a fifth section view illustrating the manufacturing method for the compound semiconductor device according to the seventh embodiment.
Figure 21E:
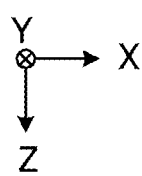
Figure 22A:
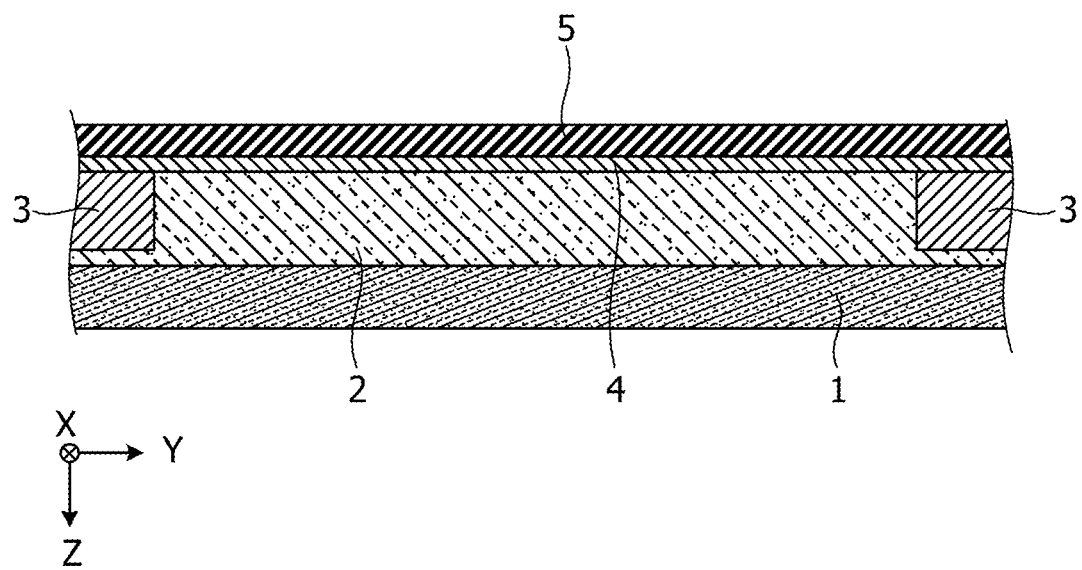
FIG. 22A is a fifteenth section view illustrating the manufacturing method for the compound semiconductor device according to the seventh embodiment.

Thereafter, as illustrated in FIGS. 21E and 22A, the resist pattern 51 is removed together with the tensile stress film 5 thereover.

Figure 21F:
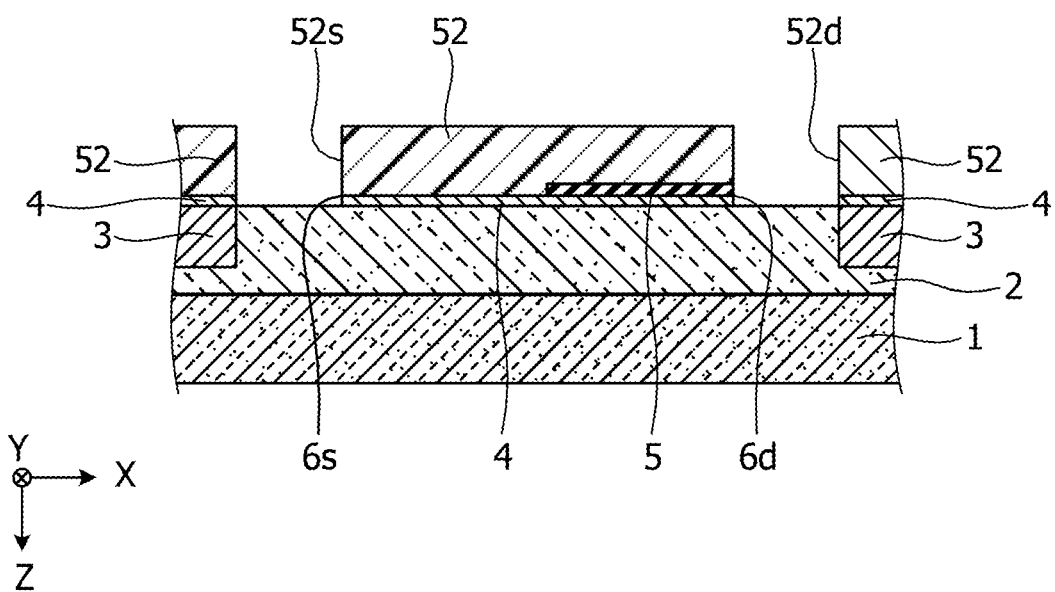
FIG. 21F is a sixth section view illustrating the manufacturing method for the compound semiconductor device according to the seventh embodiment.

Subsequently, as illustrated in FIG. 21F, a resist pattern 52 having an opening portion 52s in the region where the source electrode is to be formed and an opening portion 52d in the region where the drain electrode is to be formed is formed over the protective film 4 and the tensile stress film 5. Next, dry etching of the protective film 4 is performed by using the resist pattern 52 as a mask, to define, in the protective film 4, an opening portion 6s following the opening portion 52s and an opening portion 6d following the opening portion 52d. For the dry etching of the protective film 4, for example, $SF_6$ is used as the etching gas.

Figure 21G:
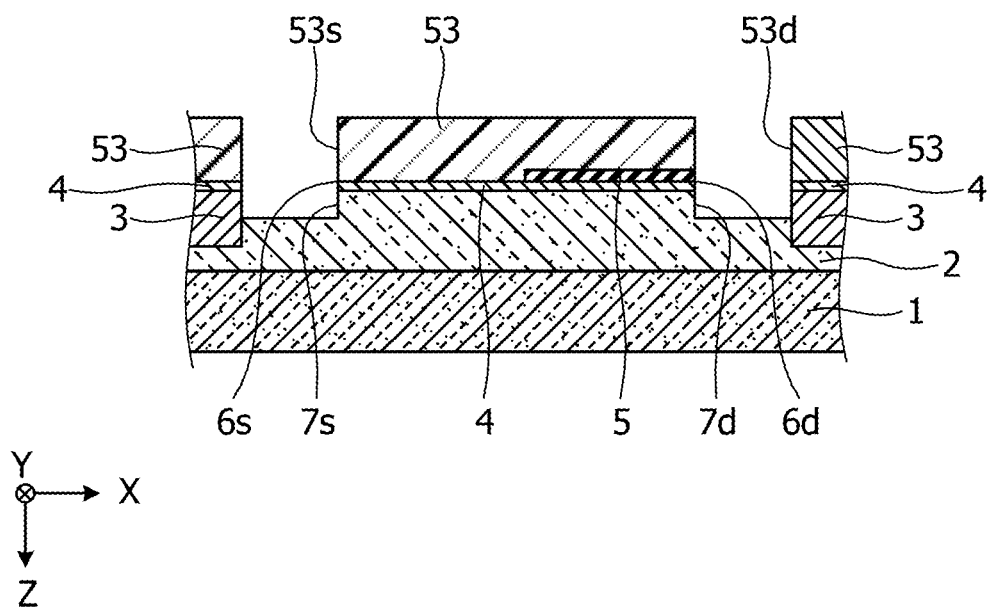
FIG. 21G is a seventh section view illustrating the manufacturing method for the compound semiconductor device according to the seventh embodiment.

Thereafter, as illustrated in FIG. 21G, the resist pattern 52 is removed by using, for example, a heated organic solvent. Subsequently, a resist pattern 53 having an opening portion 53s in the region where the source electrode is to be formed and an opening portion 53d in the region where the drain electrode is to be formed is formed over the protective film 4 and the tensile stress film 5. Then, by performing dry etching of the semiconductor laminate structure 2 by using the resist pattern 53 as a mask, a recess 7s following the opening portion 53s and a recesses 7d following the opening portion 53d are defined in the semiconductor laminate structure 2. In the dry etching of the semiconductor laminate structure 2, for example, an inert gas and a chlorine-based gas such as $Cl_2$ gas are used as etching gases. In the dry etching of the semiconductor laminate structure 2, for example, the cap layer 2f is etched. In the depth direction of the recesses 7s and 7d, part of the cap layer 2f may be kept, and part of the electron supply layer 2e may be removed. That is, the depths of the recesses 7s and 7d do not have to match the thickness of the cap layer 2f. For example, the depths of the recesses 7s and 7d are set to be within double the total thickness of the cap layer 2f and the electron supply layer 2e.

Figure 21H:
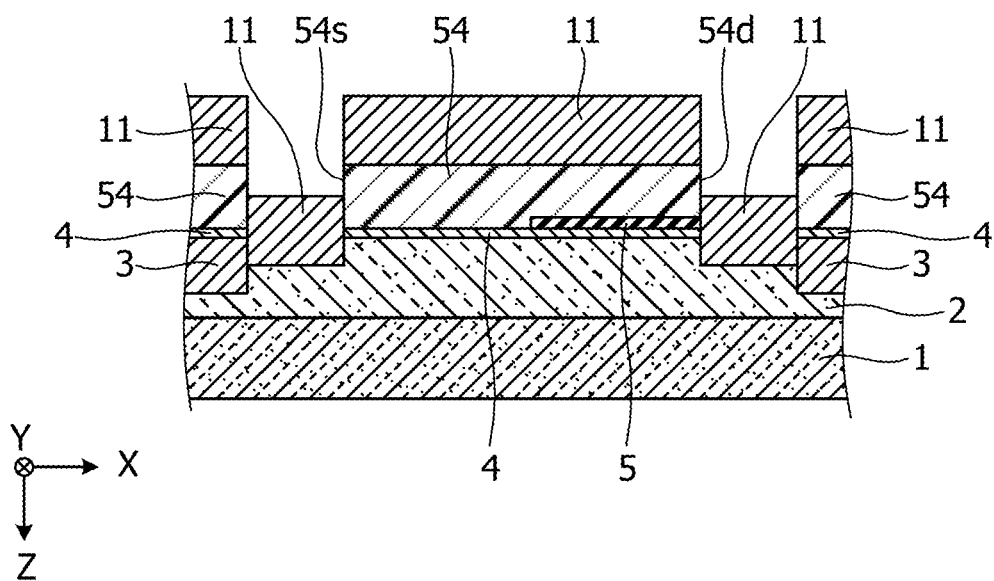
FIG. 21H is an eighth section view illustrating the manufacturing method for the compound semiconductor device according to the seventh embodiment.

Thereafter, as illustrated in FIG. 21H, the resist pattern 53 is removed by using a heated organic solvent. Subsequently, a resist pattern 54 having an opening portion 54s in the region where the source electrode is to be formed and an opening portion 54d in the region where the drain electrode is to be formed is formed over the protective film 4 and the tensile stress film 5. Then, a metal film 11 is formed inside the recess 7s and the opening portion 6s and inside the recess 7d and the opening portion 6d. In the formation of the metal film 11, for example, a Ti layer is formed by a high vacuum deposition method, and an Al layer is formed over the Ti layer by a high vacuum deposition method. For example, the Ti layer has a thickness of 10 nm to 30 nm, and the Al layer has a thickness of 100 nm to 300 nm. The metal film 11 is also formed over the resist pattern 54.

Figure 21I:
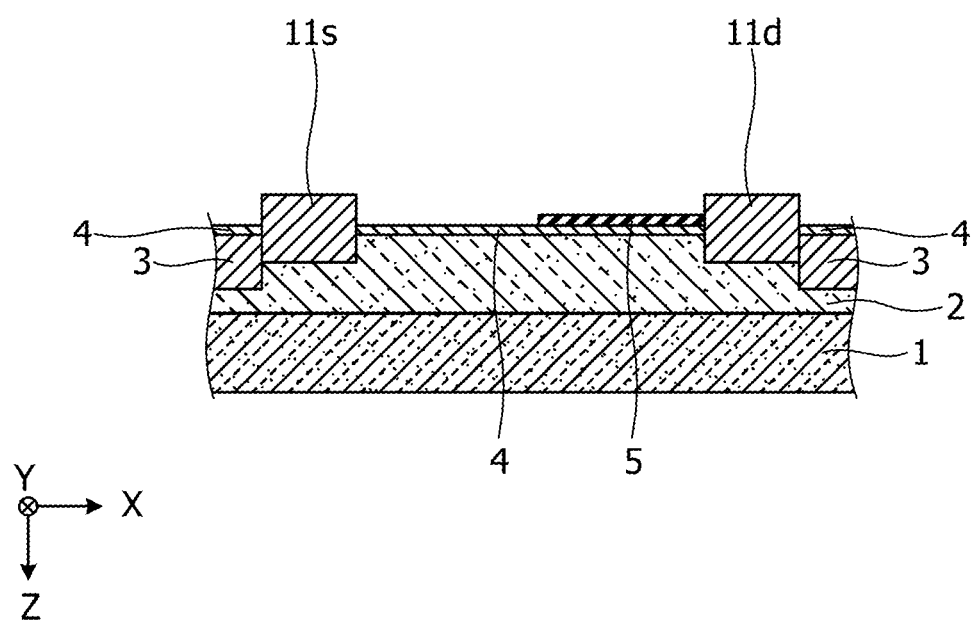
FIG. 21I is a ninth section view illustrating the manufacturing method for the compound semiconductor device according to the seventh embodiment.

Then, as illustrated in FIG. 21I, the resist pattern 54 is removed together with the metal film 11 thereover. As a result, a source electrode its is formed inside the recess 7s and the opening portion 6s, and a drain electrode 11d is formed inside the recess 7d and the opening portion 6d. As described above, in the formation of the source electrode its and the drain electrode lid, for example, techniques of vapor deposition and lift-off may be used. Thereafter, heat treatment (alloying treatment) at 550° C. to 650° C. is performed to bring the source electrode its and the drain electrode 11d into ohmic contact with the surface of the semiconductor laminate structure 2.

Figure 22B:
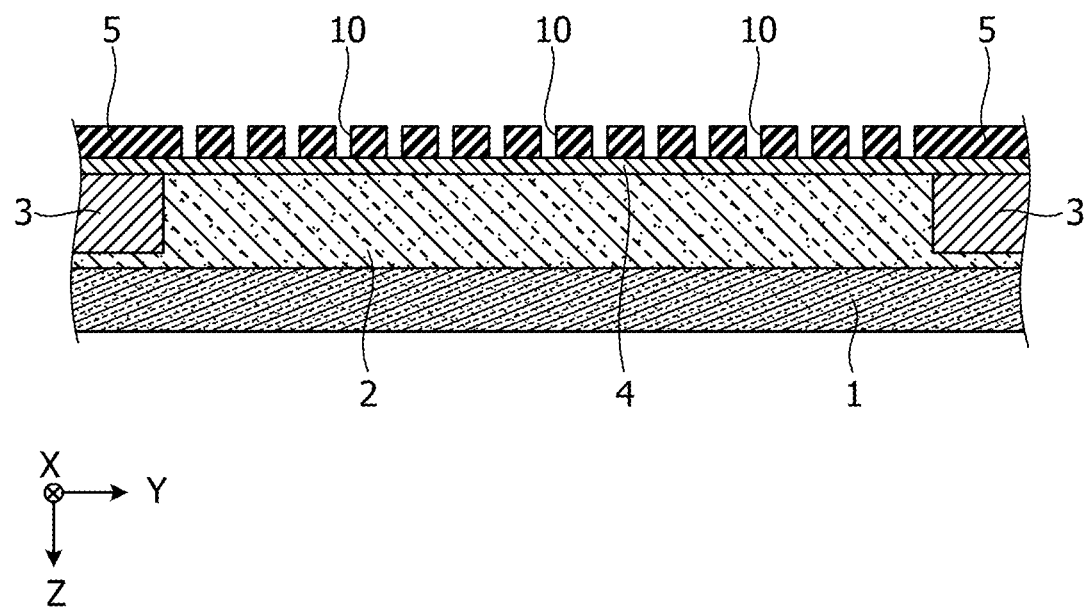
FIG. 22B is a sixteenth section view illustrating the manufacturing method for the compound semiconductor device according to the seventh embodiment.

Subsequently, as illustrated in FIG. 22B, slits 10 are defined in the tensile stress film 5. In the definition of the slits 10, for example, a resist pattern having opening portions in the regions where the slits 10 are to be defined is formed over the protective film 4, the tensile stress film 5, the source electrode 11s, and the drain electrode 11d. Then, by performing dry etching of the tensile stress film 5 by using this resist pattern as a mask, slits 10 are defined in the tensile stress film 5. For the dry etching of the tensile stress film 5, for example, an etching gas such as $SF_6$ is used.

A portion that covers the regions where the slits 10 are to be defined may be provided in the resist pattern 51, and the slits 10 may be defined when forming the tensile stress film 5.

Figure 21J:
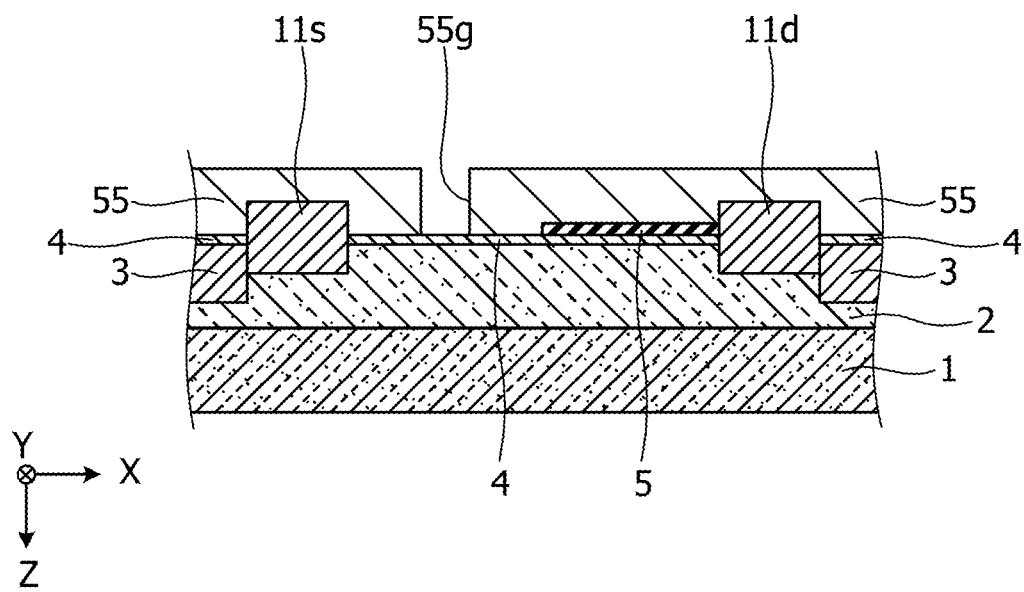
FIG. 21J is a tenth section view illustrating the manufacturing method for the compound semiconductor device according to the seventh embodiment.

Subsequently, as illustrated in FIG. 21J, a resist pattern 55 having an opening portion 55g in the region where the gate electrode is to be formed is formed over the protective film 4, the tensile stress film 5, the source electrode 11s, and the drain electrode 11d. As a material of the resist pattern 55, for example, ZEP520 manufactured by Zeon Corporation may be used. This resist material may be applied by a spin coating method. The resist pattern 55 has a thickness of, for example, 200 nm to 400 nm. The opening portion 55g may be defined by exposure and development by electron-beam lithography. In the exposure in the formation of the opening portion 55g, electron-beam lithography is performed in a length of, for example, 300 nm to 500 nm in the X direction.

Figure 21K:
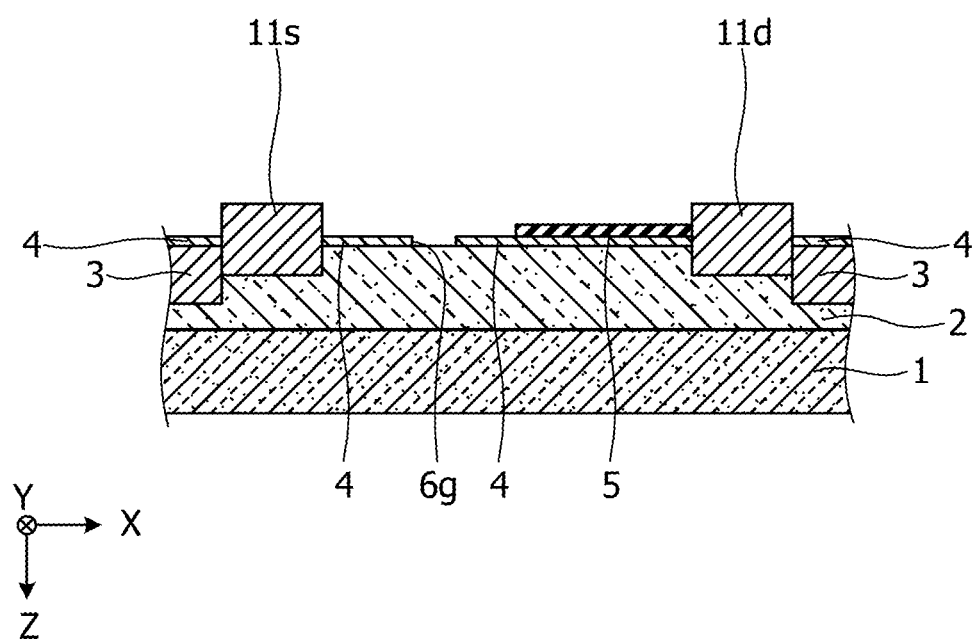
FIG. 21K is an eleventh section view illustrating the manufacturing method for the compound semiconductor device according to the seventh embodiment.

Next, as illustrated in FIG. 21K, dry etching of the protective film 4 is performed by using the resist pattern 55 as a mask, to define, in the protective film 4, an opening portion 6g following the opening portion 55g. For the dry etching of the protective film 4, for example, $SF_6$ is used as the etching gas. Thereafter, the resist pattern 55 is removed by using a heated organic solvent.

Figure 21L:
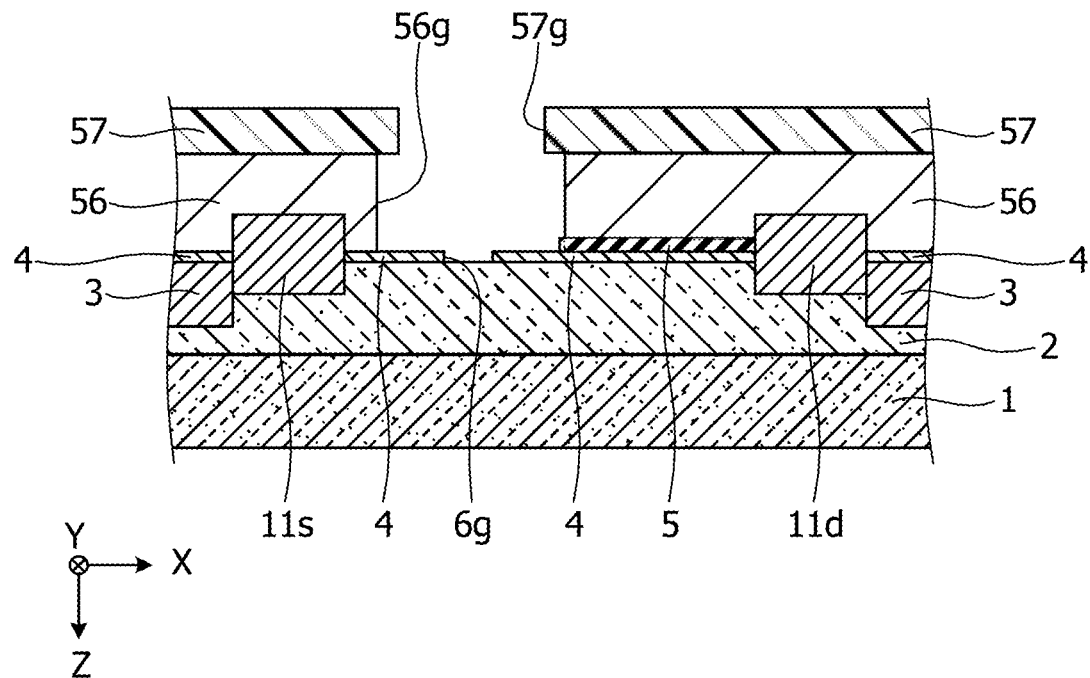
FIG. 21L is a twelfth section view illustrating the manufacturing method for the compound semiconductor device according to the seventh embodiment.

Subsequently, as illustrated in FIG. 21L, a resist pattern 56 having an opening portion 56g in the region where the gate electrode is to be formed is formed over the protective film 4, the tensile stress film 5, the source electrode 11s, and the drain electrode 11d. At the same time, a resist pattern 57 having an opening portion 57g is formed over the resist pattern 56 in the region where the gate electrode is to be formed. In the formation of the resist patterns 56 and 57, two resist layers are formed first, and then the resist pattern 57 is formed by defining the opening portion 57g in the upper resist layer. Then, the opening portion 56g is defined in the lower resist layer by using the resist pattern 57 as a mask, and thus the resist pattern 56 having a set-back structure having a dimension in the X direction of 0.3 μm to 0.7 μm is formed. As a material of the resist pattern 56, for example, poly(methyl glutarimide) (PMGI) (for example, manufactured by MicroChem Corporation) may be used, and as a material of the resist pattern 57, for example, ZEP520 manufactured by Zeon Corporation may be used. These resist materials may be applied by a spin coating method, and pre-baking is performed after the application. In the exposure at the time of defining the opening portion 57g, for example, electron-beam lithography is performed in a length of 1.0 μm to 1.5 μm in the X direction, and ZEP-SD manufactured by Zeon Corporation may be used as a developer liquid. For defining the opening portion 56g, for example, NMD-W manufactured by Tokyo Ohka Kogyo Co., Ltd. may be used as a developer liquid. In this manner, a resist pattern of eaves structure (set-back structure) is obtained.

Figure 21M:
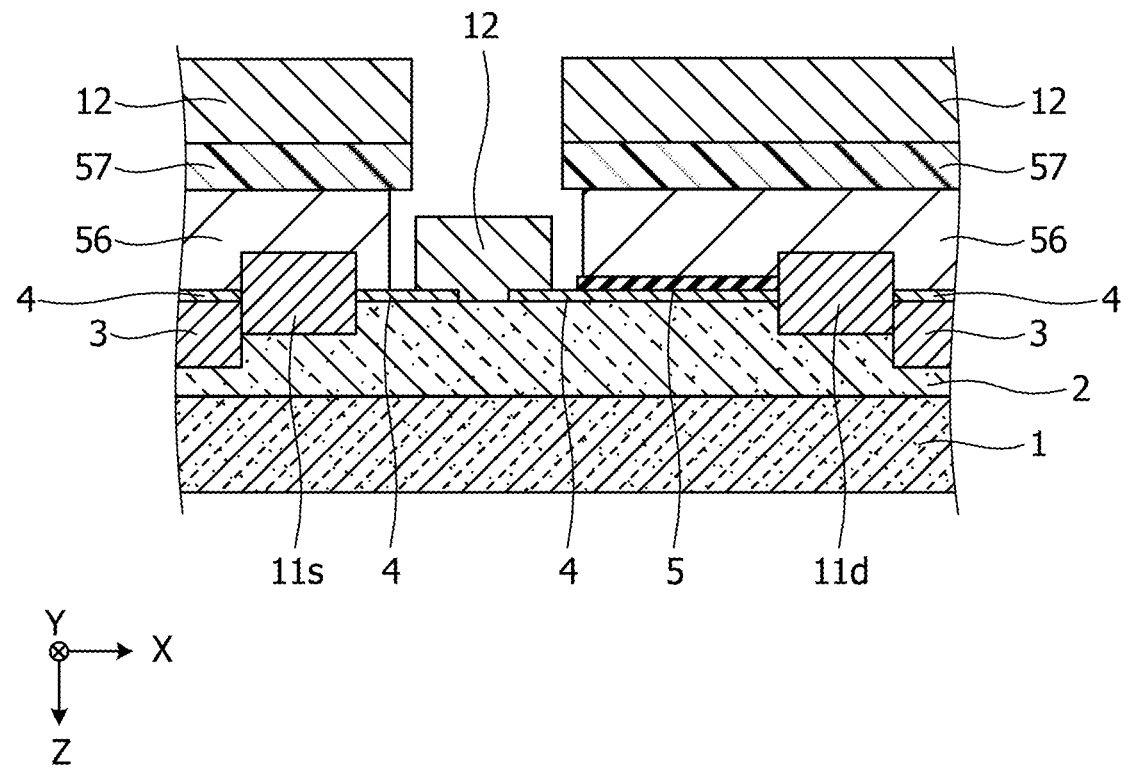
FIG. 21M is a thirteenth section view illustrating the manufacturing method for the compound semiconductor device according to the seventh embodiment.
Figure 21N:
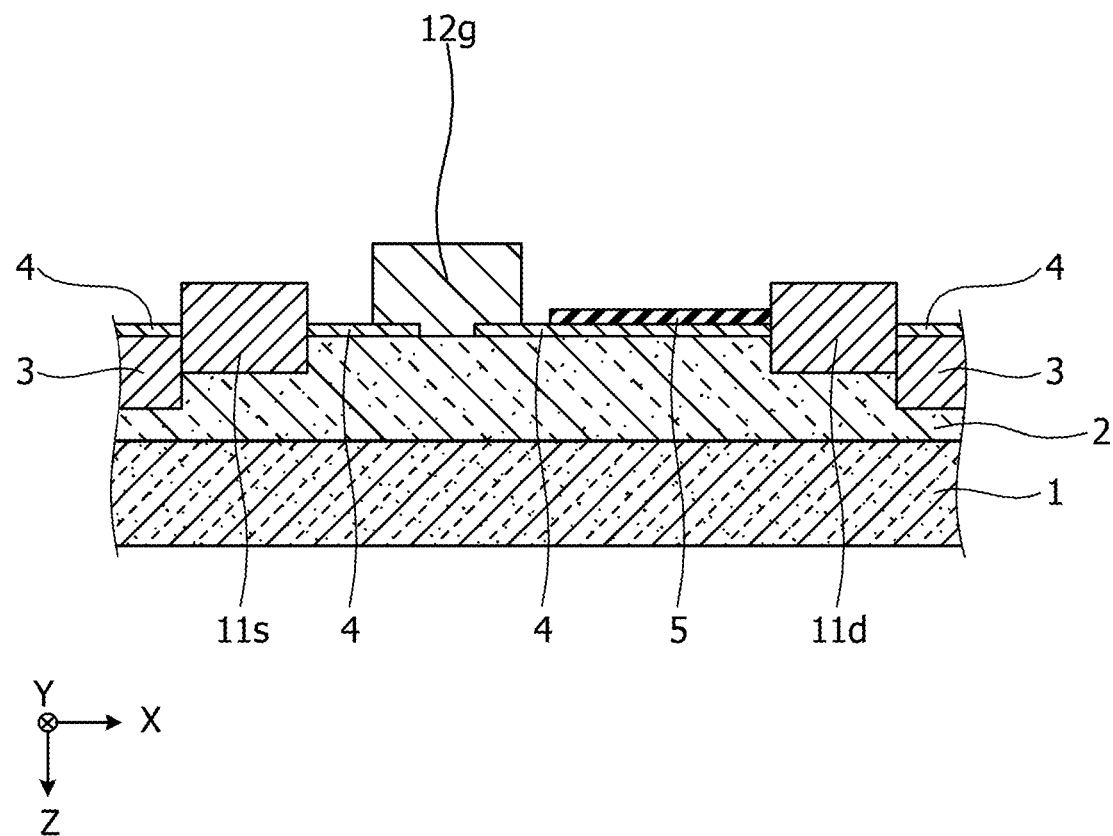
FIG. 21N is a fourteenth section view illustrating the manufacturing method for the compound semiconductor device according to the seventh embodiment.

Thereafter, as illustrated in FIG. 21M, a metal film 12 in contact with the semiconductor laminate structure 2 through the opening portion 6g is formed over the protective film 4 inside the opening portions 56g and 57g. In the formation of the metal film 12, for example, an Ni layer is formed by a high vacuum deposition method, and an Au layer is formed over the Ni layer by a high vacuum deposition method. For example, the Ni layer has a thickness of 10 nm to 30 nm, and the Au layer has a thickness of 200 nm to 400 nm. The metal film 12 is also formed over the resist pattern 57.

Subsequently, as illustrated in FIG. 21N, the resist patterns 57 and 56 are removed together with the metal film 12 thereover. As a result, the gate electrode 12g in contact with the semiconductor laminate structure 2 through the opening portion 6g is formed over the protective film 4. As described above, in the formation of the gate electrode 12g, for example, techniques of vapor deposition and lift-off may be used.

Then, a protective film and wiring are formed if necessary, and thus the compound semiconductor device is completed.

The formation of the protective film 4 may be omitted. The slits 10 may be defined so as to extend to the gate electrode 12g in the X direction. A compressive stress film may be formed in the slits 10. The tensile stress film 5 may be also formed between the source electrode its and the gate electrode 12g. A compressive stress film may be formed instead of the tensile stress film 5. In this case, tensile stress may be generated in the slits of the compressive stress film. The definition of the opening portion 6g may be omitted, and the gate electrode 112g may be formed so as to be in contact with the protective film 4.

Modification Example of Seventh Embodiment

Figure 23A:
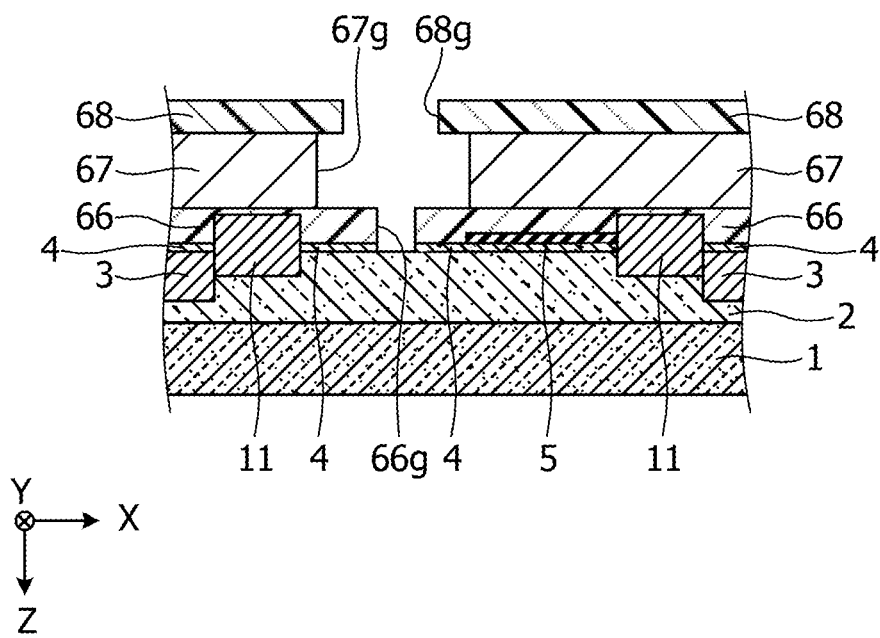
FIG. 23A is a first section view illustrating a modification example of the manufacturing method for the compound semiconductor device according to the seventh embodiment.
Figure 23B:
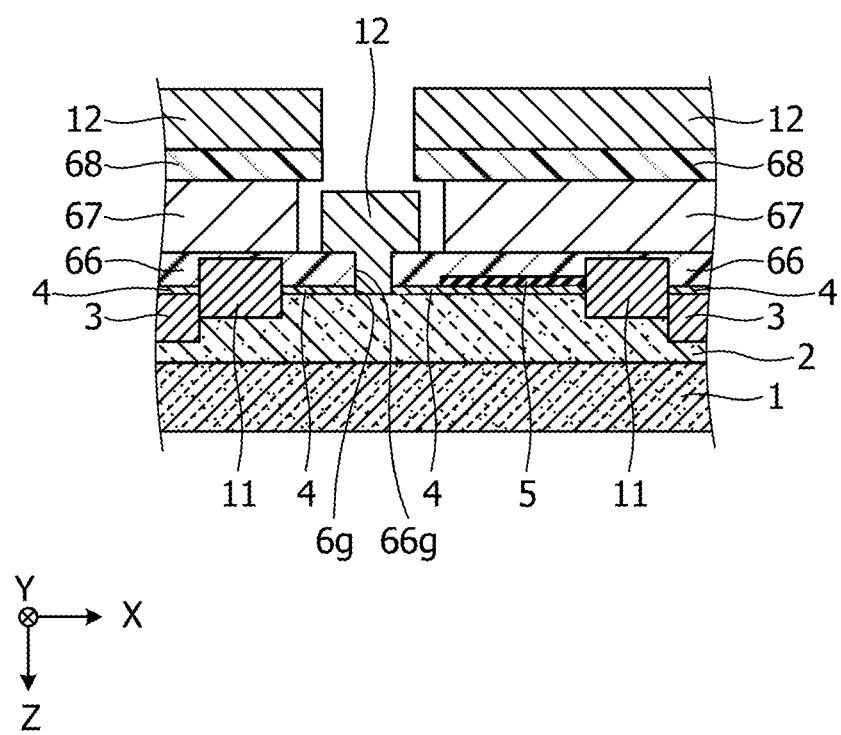
FIG. 23B is a second section view illustrating the modification example of the manufacturing method for the compound semiconductor device according to the seventh embodiment.
Figure 23C:
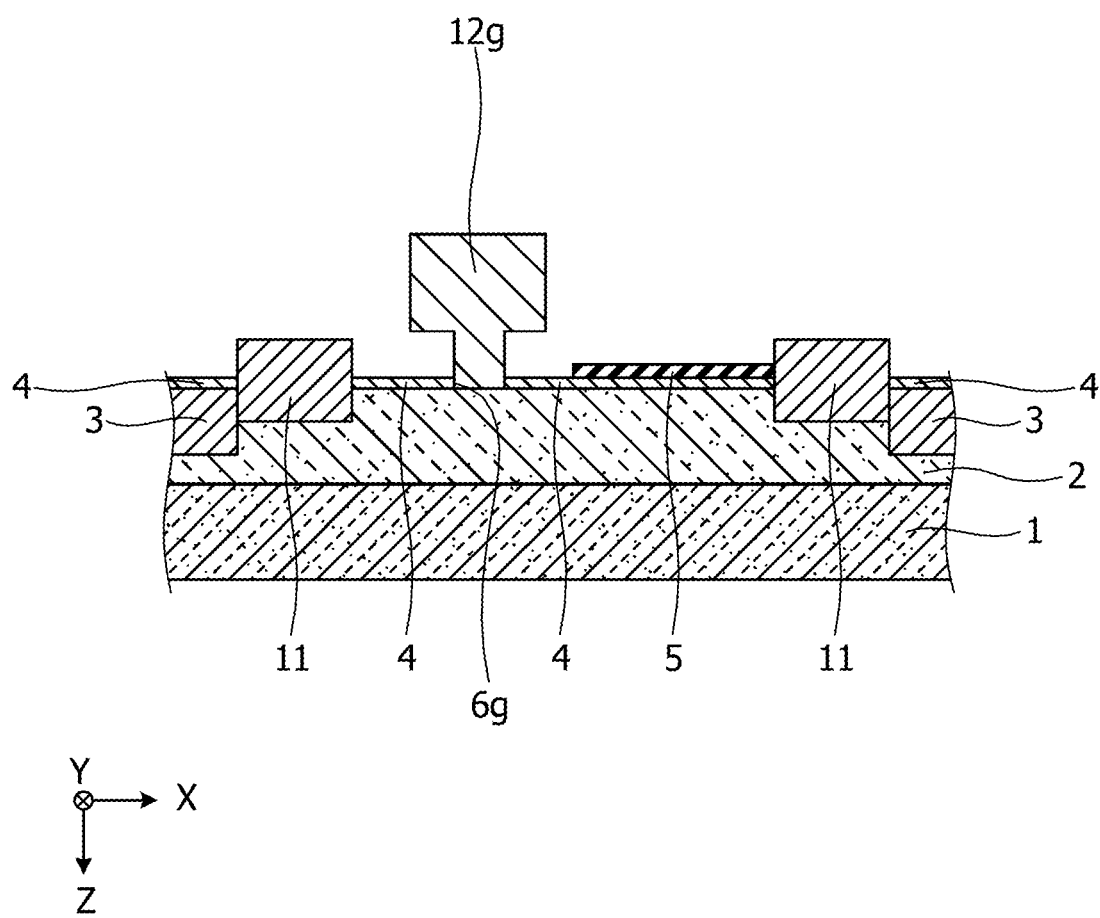
FIG. 23C is a third section view illustrating the modification example of the manufacturing method for the compound semiconductor device according to the seventh embodiment.

A modification example of the seventh embodiment is different from the seventh embodiment in terms of a method of forming the gate electrode 12g. FIGS. 23A to 23C are each a section view illustrating the modification example of the manufacturing method for the compound semiconductor device according to the seventh embodiment.

In this modification example, first, as illustrated in FIG. 23A, the processes up to the definition of the opening portion 6g are performed in the same manner as in the seventh embodiment. Then, a resist pattern 66 having an opening portion 66g in the region where the gate electrode is to be formed is formed over the protective film 4, the tensile stress film 5, the source electrode 11s, and the drain electrode 11d. At the same time, a resist pattern 67 having an opening portion 67g in the region where the gate electrode is to be formed is formed over the resist pattern 66, and a resist pattern 68 having an opening portion 68g in the region where the gate electrode is to be formed is formed over the resist pattern 67. In the formation of the resist patterns 66 to 68, three resist layers are formed first, and then the resist pattern 68 is formed by defining the opening portion 68g in the upper resist layer. Then, the opening portion 67g is defined in the middle resist layer by using the resist pattern 68 as a mask, and thus the resist pattern 67 having a set-back structure having a dimension in the X direction of 0.3 μm to 0.7 μm is formed. Thereafter, the resist pattern 66 is formed by defining the opening portion 66g in the lower resist layer. As a material of the resist pattern 66, for example, polymethyl methacrylate (PMMA) (for example, manufactured by Microchem Corporation) may be used. As a material of the resist pattern 67, for example, polymethyl glutarimide (PMGI) (for example, manufactured by Microchem Corporation) may be used. As a material of the resist pattern 68, for example, ZEP520 manufactured by Zeon Corporation may be used. These resist materials may be applied by a spin coating method, and pre-baking is performed after the application. In the exposure at the time of defining the opening portion 68g, for example, electron-beam lithography is performed in a length of 1.0 μm to 1.5 μm in the X direction, and ZEP-SD manufactured by Zeon Corporation may be used as a developer liquid. For defining the opening portion 67g, for example, NMD-W manufactured by Tokyo Ohka Kogyo Co., Ltd. may be used as a developer liquid. In the exposure at the time of defining the opening portion 66g, for example, electron-beam lithography is performed in a length of 0.3 μm to 0.5 μm in the X direction, and ZMD-B manufactured by Zeon Corporation may be used as a developer liquid.

Thereafter, as illustrated in FIG. 23B, the metal film 12 in contact with the semiconductor laminate structure 2 through the opening portions 66g and 6g is formed over the resist pattern 66 inside the opening portions 67g and 68g. The metal film 12 is also formed over the resist pattern 68.

Subsequently, as illustrated in FIG. 23C, the resist patterns 68, 67, and 66 are removed together with the metal film 12 thereover. As a result, the gate electrode 12g in contact with the semiconductor laminate structure 2 through the opening portion 6g is formed. As described above, in the formation of the gate electrode 12g, for example, techniques of vapor deposition and lift-off may be used. According to this modification example, the gate electrode 12g having a T-shaped cross-section is formed.

Then, a protective film and wiring are formed if necessary, and thus the compound semiconductor device is completed.

Figure 24A:
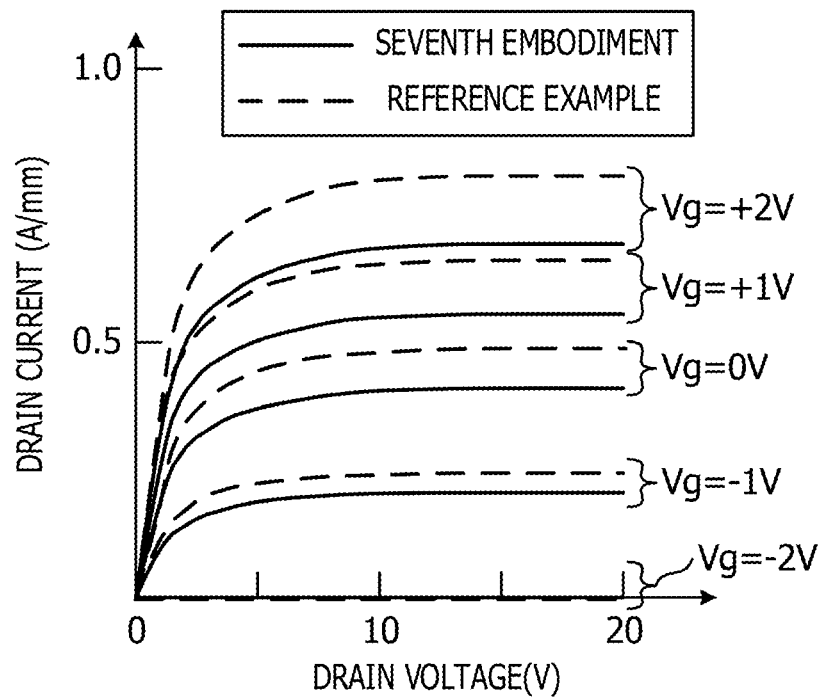
FIG. 24A is a first diagram illustrating a relationship between drain voltage and drain current.
Figure 24B:
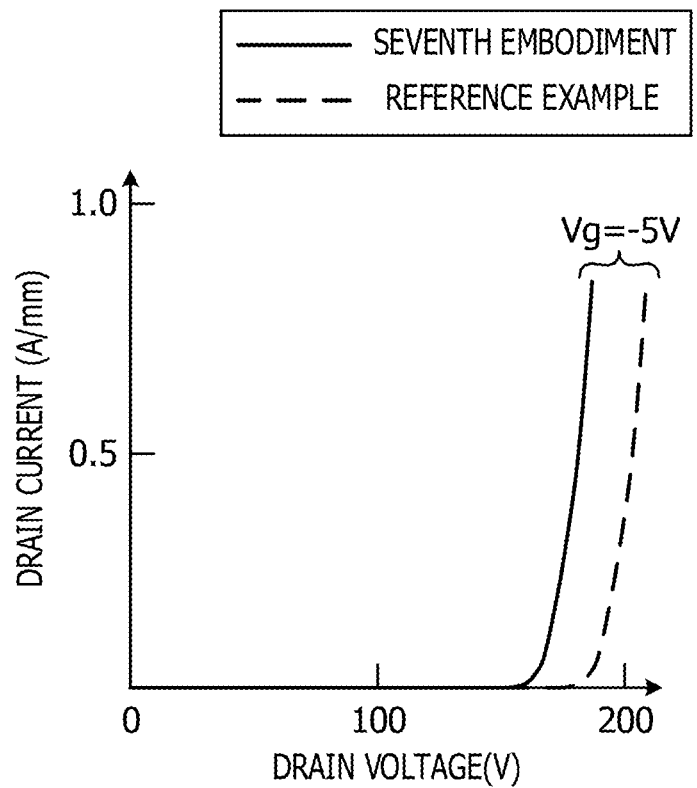
FIG. 24B is a second diagram illustrating a relationship between drain voltage and drain current.

FIGS. 24A and 24B illustrate three-terminal characteristics of the compound semiconductor device manufactured according to the seventh embodiment. FIG. 24A illustrates the relationship between the drain voltage and the drain current when the gate voltage Vg is set to −2 V, −1 V, 0 V, +1 V, and +2 V in the case where the drain voltage is 0 V to 20 V. FIG. 24B illustrates the relationship between the drain voltage and the drain current when the gate voltage Vg is set to −5 V in the case where the drain voltage is 0 V to 200 V. FIGS. 24A and 24B also illustrate the three-terminal characteristics of a reference example in which the formation of the tensile stress film 5 is omitted.

As illustrated in FIGS. 24A and 24B, according to the compound semiconductor device manufactured according to the seventh embodiment, the on-resistance may be reduced, the drain current may be increased, and the drain breakdown voltage may be improved. This indicates that high output and high efficiency of an amplifier to which the compound semiconductor device is applied may be realized.

Eighth Embodiment

Figure 25:
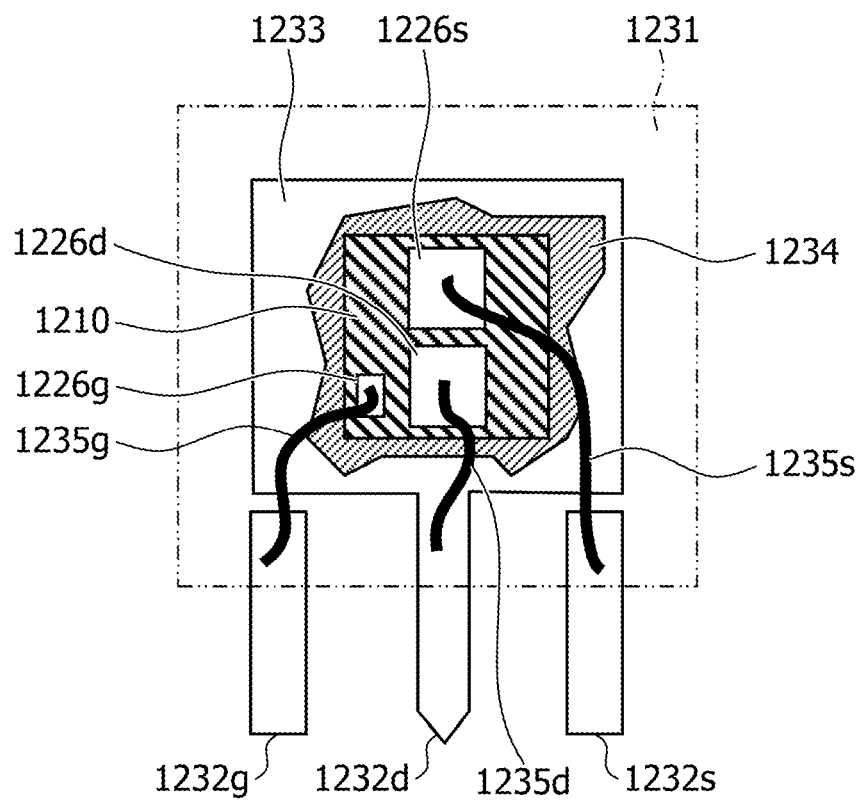
FIG. 25 is a diagram illustrating a discrete package according to an eighth embodiment.

Next, an eighth embodiment will be described. The eighth embodiment relates to a discrete package of an HEMT. FIG. 25 is a diagram illustrating the discrete package according to the eighth embodiment.

In the eighth embodiment, as illustrated in FIG. 25, the back side of a compound semiconductor device 1210 having a structure similar to any one of the first to sixth embodiments is fixed to a land (die pad) 1233 by using a die attaching agent 1234 such as solder. A first end of a wire 1235d such as an Al wire is coupled to a drain pad 1226d to which the drain electrode 11d is coupled, and a second end of the wire 1235d is coupled to a drain lead 1232d integrated with the land 1233. A first end of a wire 1235s such as an Al wire is coupled to a source pad 1226s to which the source electrode 11s coupled, and a second end of the wire 1235s is coupled to a source lead 1232s independent from the land 1233. A first end of a wire 1235g such as an Al wire is coupled to a gate pad 1226g to which the gate electrode 12g is coupled, and a second end of the wire 1235g is coupled to a gate lead 1232g independent from the land 1233. Further, the land 1233, the compound semiconductor device 1210, and so forth are packaged by a mold resin 1231 such that part of the gate lead 1232g, part of the drain lead 1232d, and part of the source lead 1232s project.

For example, such a discrete package may be manufactured as follows. First, the compound semiconductor device 1210 is fixed to the land 1233 of a lead frame by using the die attaching agent 1234 such as solder. Next, via bonding using the wires 1235g, 1235d, and 1235s, the gate pad 1226g is coupled to the gate lead 1232g of the lead frame, the drain pad 1226d is coupled to the drain lead 1232d of the lead frame, and the source pad 1226s is coupled to the source lead 1232s of the lead frame. Then, sealing is performed by a transfer mold method using the mold resin 1231. Subsequently, the lead frame is cut off.

Ninth Embodiment

Figure 26:
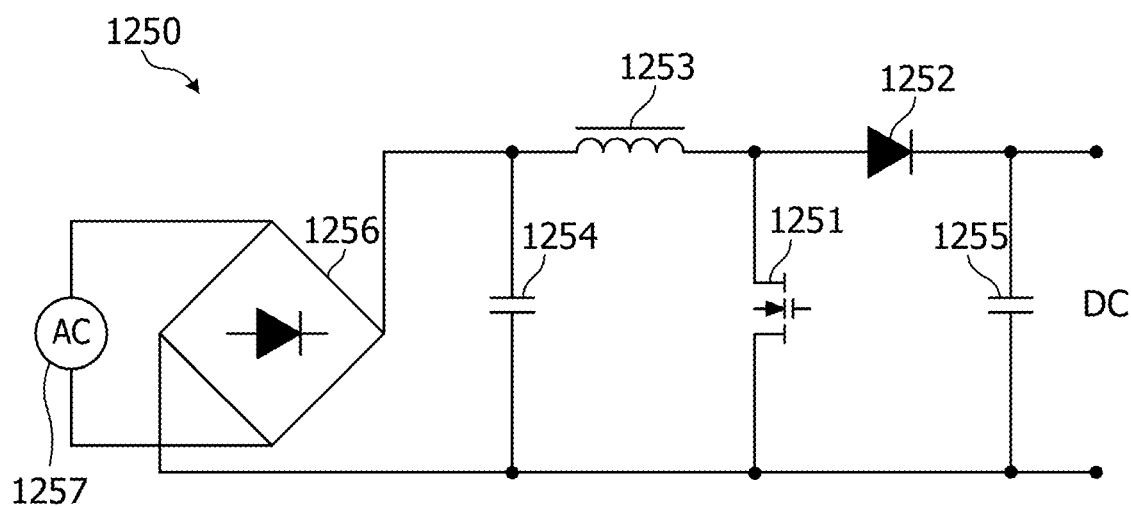
FIG. 26 is a wiring diagram illustrating a PFC circuit according to a ninth embodiment.

Next, a ninth embodiment will be described. The ninth embodiment relates to a power factor correction (PFC) circuit including an HEMT. FIG. 26 is a wiring diagram illustrating the PFC circuit according to the ninth embodiment.

A PFC circuit 1250 includes a switch element (transistor) 1251, a diode 1252, a choke coil 1253, capacitors 1254 and 1255, a diode bridge 1256, and an alternate current power source (AC) 1257. A drain electrode of the switch element 1251 is coupled to an anode terminal of the diode 1252 and a first terminal of the choke coil 1253. A source electrode of the switch element 1251 is coupled to a first terminal of the capacitor 1254 and a first terminal of the capacitor 1255. A second terminal of the capacitor 1254 is coupled to a second terminal of the choke coil 1253. A second terminal of the capacitor 1255 is coupled to a cathode terminal of the diode 1252. A gate driver is coupled to a gate electrode of the switch element 1251. The AC 1257 is coupled to the first and second terminals of the capacitor 1254 with the diode bridge 1256 therebetween. A direct current power source (DC) is coupled to the first and second terminals of the capacitor 1255. In the present embodiment, a compound semiconductor device having a similar structure to any one of the first to sixth embodiments is used as the switch element 1251.

When manufacturing the PFC circuit 1250, for example, the switch element 1251 is coupled to the diode 1252, the choke coil 1253, and so forth by using solder.

Tenth Embodiment

Figure 27:
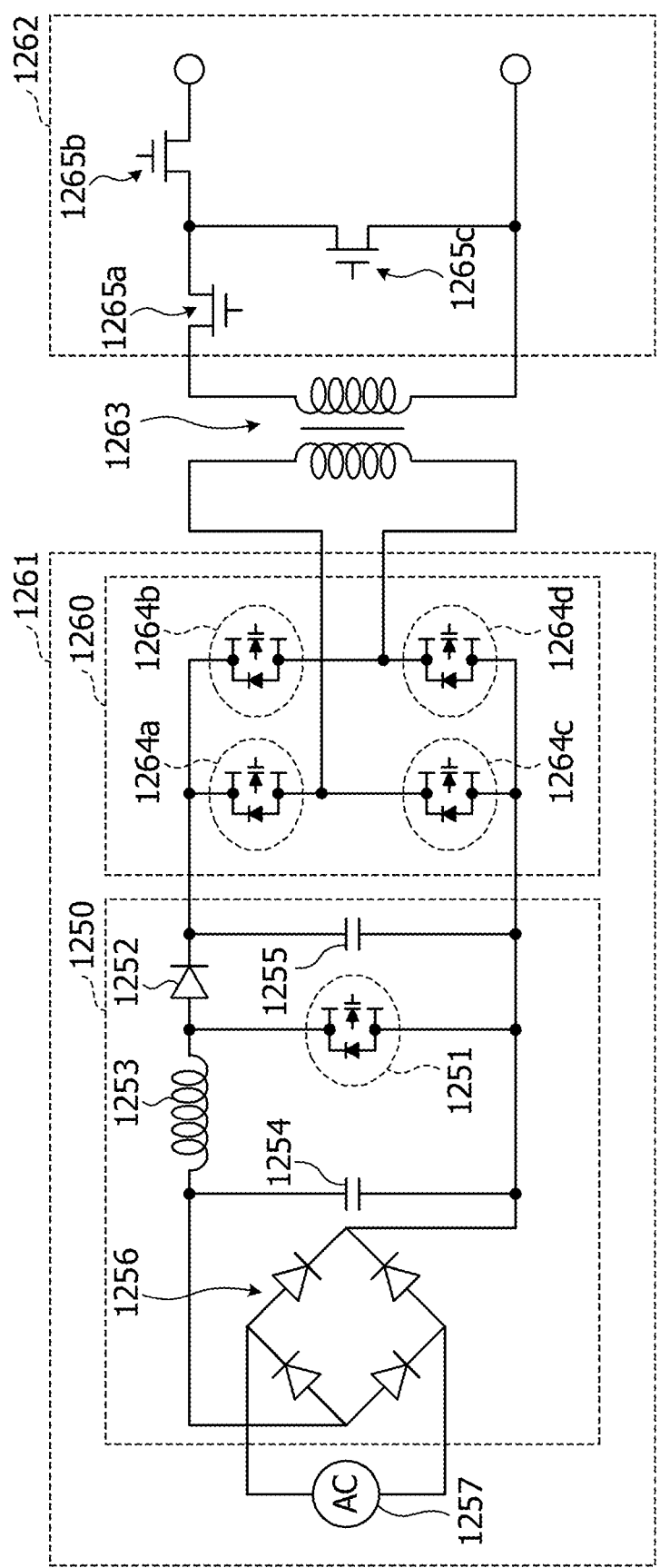
FIG. 27 is a wiring diagram illustrating a power source apparatus according to a tenth embodiment.

Next, a tenth embodiment will be described. The tenth embodiment relates to a power source apparatus including an HEMT that is suitable for a server power source. FIG. 27 is a wiring diagram illustrating the power source apparatus according to the tenth embodiment.

The power source apparatus includes a primary circuit 1261 of high voltage, a secondary circuit 1262 of low voltage, and a transformer 1263 provided between the primary circuit 1261 and the secondary circuit 1262.

The primary circuit 1261 includes the PFC circuit 1250 according to the ninth embodiment, and an inverter circuit coupled to the first and second terminals of the capacitor 1255 of the PFC circuit 1250, for example, a full-bridge inverter circuit 1260. The full-bridge inverter circuit 1260 includes a plurality of (in this case, four) switch elements 1264a, 1264b, 1264c, and 1264d.

The secondary circuit 1262 includes a plurality of (in this case, three) switch elements 1265a, 1265b, and 1265c.

In the present embodiment, compound semiconductor devices having a similar structure to any one of the first to sixth embodiments are used for the switch element 1251 of the PFC circuit 1250 constituting the primary circuit 1261 and the switch elements 1264a, 1264b, 1264c, and 1264d of the full-bridge inverter circuit 1260. In contrast, normal metal-insulator-semiconductor-type field effect transistors (MIS-FETs) formed from silicon are used for the switch elements 1265a, 1265b, and 1265c of the secondary circuit 1262.

Eleventh Embodiment

Figure 28:
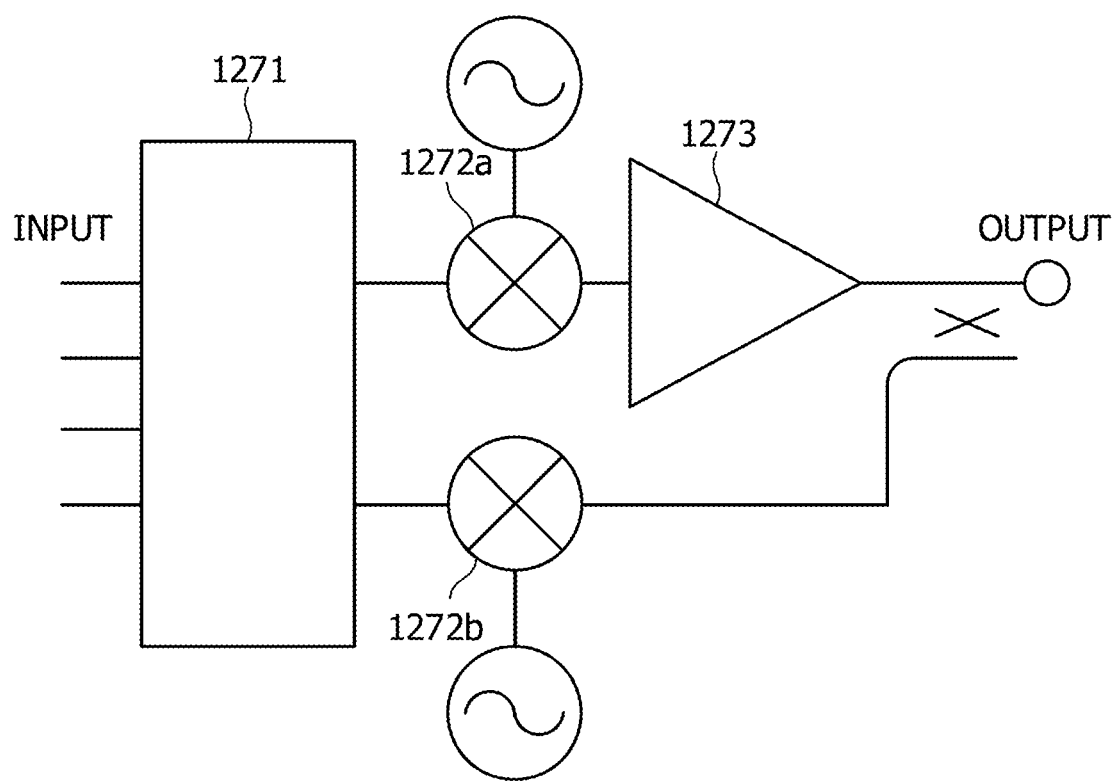
FIG. 28 is a wiring diagram illustrating an amplifier according to an eleventh embodiment.

Next, an eleventh embodiment will be described. The eleventh embodiment relates to an amplifier including an HEMT. FIG. 28 is a wiring diagram illustrating the amplifier according to the eleventh embodiment.

The amplifier includes a digital predistortion circuit 1271, mixers 1272a and 1272b, and a power amplifier 1273.

The digital predistortion circuit 1271 compensates nonlinear distortion of an input signal. The mixer 1272a mixes the input signal whose nonlinear distortion has been compensated with an alternate current signal. The power amplifier 1273 includes a compound semiconductor device having a similar structure to any one of the first to sixth embodiments, and amplifies the input signal mixed with the alternate current signal. In the present embodiment, for example, by switching a switch, an output signal may be mixed with an alternate current signal in the mixer 1272b and transmitted to the digital predistortion circuit 1271. This amplifier may be used as a high-frequency amplifier or a high-output amplifier. The high-frequency amplifier may be used for, for example, a communication apparatus used in a mobile phone base station, a radar apparatus, and a microwave generation apparatus.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method for a compound semiconductor device, the manufacturing method comprising:

forming a semiconductor laminate structure including an electron transit layer and an electron supply layer that are from the compound semiconductor device;

forming a protective film over semiconductor laminate structure;

forming a first resist pattern having an opening portion between a region where a gate electrode is to be formed and a region where a drain electrode is to be formed over the protective film in such a manner that an end portion of the opening portion on a side of the region where the gate electrode is to be formed is spaced apart by a specific distance from the region where the gate electrode is to be formed;

forming, a first insulating film which has a first internal stress over the protective film inside the opening portion using the first resist pattern as a mask;

forming a source electrode and the drain electrode which are arranged in a first direction above the semiconductor laminate structure;

forming, in the first insulating film, a plurality of slits which extend in the first direction using, as a mask, a second resist pattern having a plurality of opening portions which is formed over the protective film, the first insulating film, the source electrode and the drain electrode; and forming, above the semiconductor laminate structure, the gate electrode which is arranged in the first direction with the source electrode and the drain electrode.

\* \* \* \* \*